United States Patent
Lee et al.

(10) Patent No.: US 11,901,346 B2
(45) Date of Patent: Feb. 13, 2024

(54) DISPLAY DEVICE INCLUDING A PLURALITY OF LINES TO APPLY DRIVING VOLTAGE TO PIXELS

(71) Applicant: Samsung Display Co., Ltd., Yongin-si (KR)

(72) Inventors: Ji Hye Lee, Yongin-si (KR); Kyung Bae Kim, Yongin-si (KR); Min Kyu Woo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 274 days.

(21) Appl. No.: 17/242,132

(22) Filed: Apr. 27, 2021

(65) Prior Publication Data
US 2022/0013509 A1 Jan. 13, 2022

(30) Foreign Application Priority Data
Jul. 10, 2020 (KR) ........................ 10-2020-0085516

(51) Int. Cl.
*H01L 25/16* (2023.01)
*H01L 27/12* (2006.01)
(Continued)

(52) U.S. Cl.
CPC ............ *H01L 25/167* (2013.01); *H01L 24/32* (2013.01); *H01L 25/162* (2013.01);
(Continued)

(58) Field of Classification Search
CPC ..... H01L 25/167; H01L 24/32; H01L 25/162; H01L 27/124; H01L 33/62;
(Continued)

(56) References Cited

U.S. PATENT DOCUMENTS

| 9,620,534 B2 | 4/2017 | Yang et al. |
| 9,893,139 B2 | 2/2018 | Kim et al. |

(Continued)

FOREIGN PATENT DOCUMENTS

| KR | 10-2016-0049381 A | 5/2016 |
| KR | 10-2017-0114027 A | 10/2017 |

(Continued)

OTHER PUBLICATIONS

International Search Report dated Sep. 27, 2021 for corresponding International Application No. PCT/KR2021/007739 (3 pages).

*Primary Examiner* — Fazli Erdem
(74) *Attorney, Agent, or Firm* — Lewis Roca Rothgerber Christie LLP

(57) ABSTRACT

A display device may include: a substrate including a display area and a non-display area; pixels in the display area, each of the pixels including first to fourth electrodes, and light emitting elements connected with the first to fourth electrodes; first pads in a pad area of the non-display area; first to third lines provided in the non-display area; and a circuit board overlapping with the pad area of the substrate and including second pads electrically connected with the first pads. The first pads may include a 1-1th pad connected to the first line, a 1-2th pad connected to the second line, and a 1-3th pad connected to the third line. An identical driving voltage may be applied to at least two lines of the first to third lines. The first to third lines may apply alignment signals to the first to fourth electrodes.

20 Claims, 21 Drawing Sheets

(51) Int. Cl.
*H01L 33/62* (2010.01)
*H01L 23/00* (2006.01)

(52) U.S. Cl.
CPC ............ *H01L 27/124* (2013.01); *H01L 33/62* (2013.01); *H01L 2224/32227* (2013.01)

(58) Field of Classification Search
CPC ....... H01L 2224/32227; H01L 27/3276; H01L 27/3297; H01L 24/95; H01L 25/16; H01L 25/0753; H01L 27/12; H01L 27/32; H01L 27/156; H10K 59/131; H10K 59/12
USPC .......................................................... 257/72
See application file for complete search history.

(56) References Cited

U.S. PATENT DOCUMENTS

| | | | |
|---|---|---|---|
| 10,367,123 B2 | 7/2019 | Im et al. | |
| 2014/0152935 A1* | 6/2014 | Heo | G02F 1/1339 349/43 |
| 2015/0221271 A1* | 8/2015 | Hwang | G09G 3/3655 345/212 |
| 2017/0288008 A1* | 10/2017 | Kim | G09G 3/3258 |
| 2019/0245126 A1* | 8/2019 | Lim | G09G 3/32 |
| 2019/0251898 A1* | 8/2019 | Cho | H01L 25/167 |
| 2019/0326348 A1* | 10/2019 | Im | H01L 33/0095 |
| 2020/0108586 A1* | 4/2020 | Ryu | H10K 50/844 |
| 2021/0296424 A1 | 9/2021 | Cho et al. | |
| 2022/0011487 A1* | 1/2022 | Park | G09G 3/3607 |
| 2023/0006119 A1* | 1/2023 | Oh | H01L 27/12 |

FOREIGN PATENT DOCUMENTS

| | | |
|---|---|---|
| KR | 10-2018-0055021 A | 5/2018 |
| KR | 10-2019-0068084 A | 6/2019 |
| KR | 10-2020-0017012 A | 2/2020 |
| KR | 10-2020-0033379 A | 3/2020 |
| KR | 10-2020-0039858 A | 4/2020 |

* cited by examiner

FIG. 14A
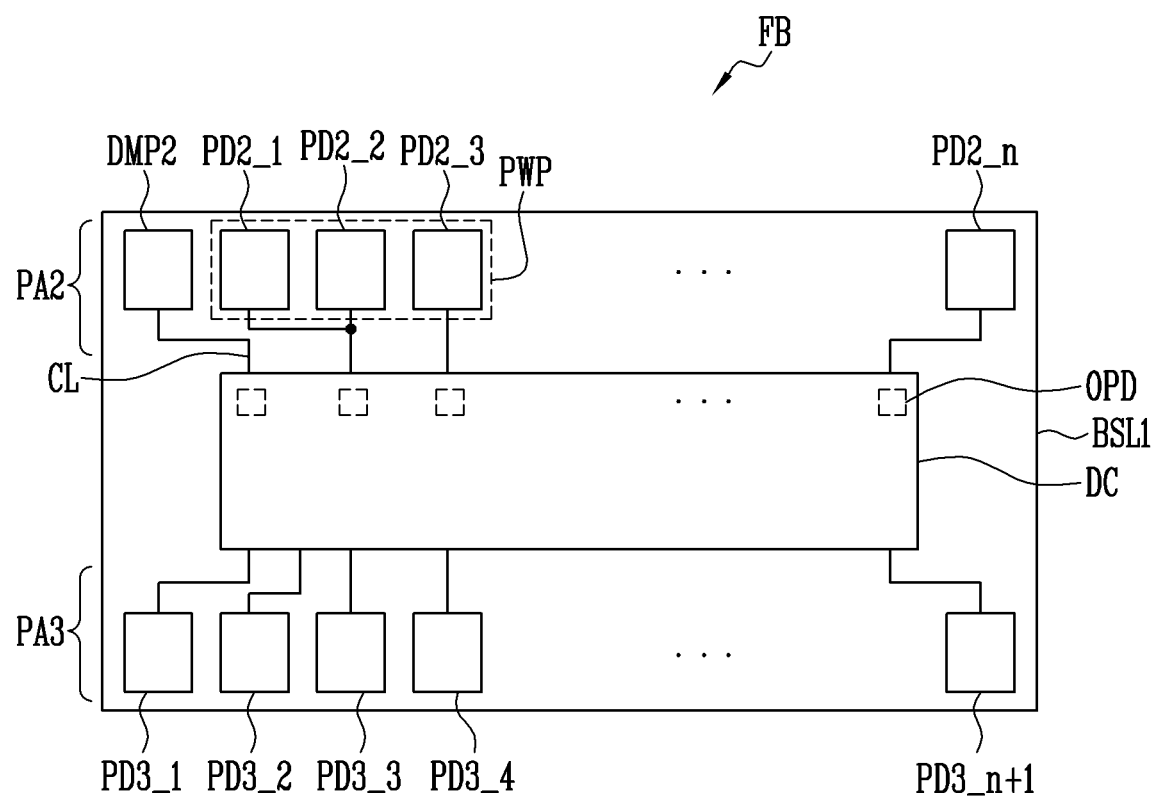
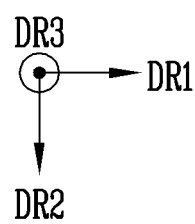

FIG. 14B
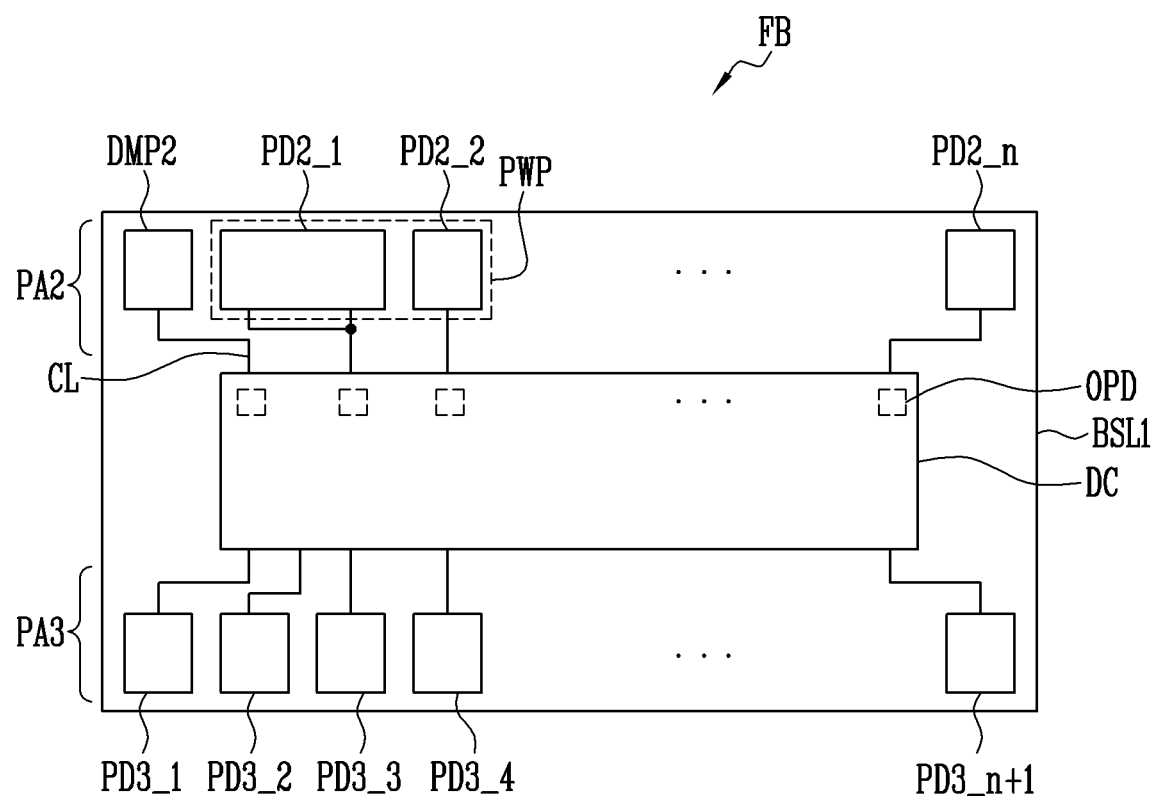
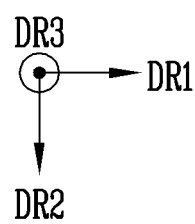

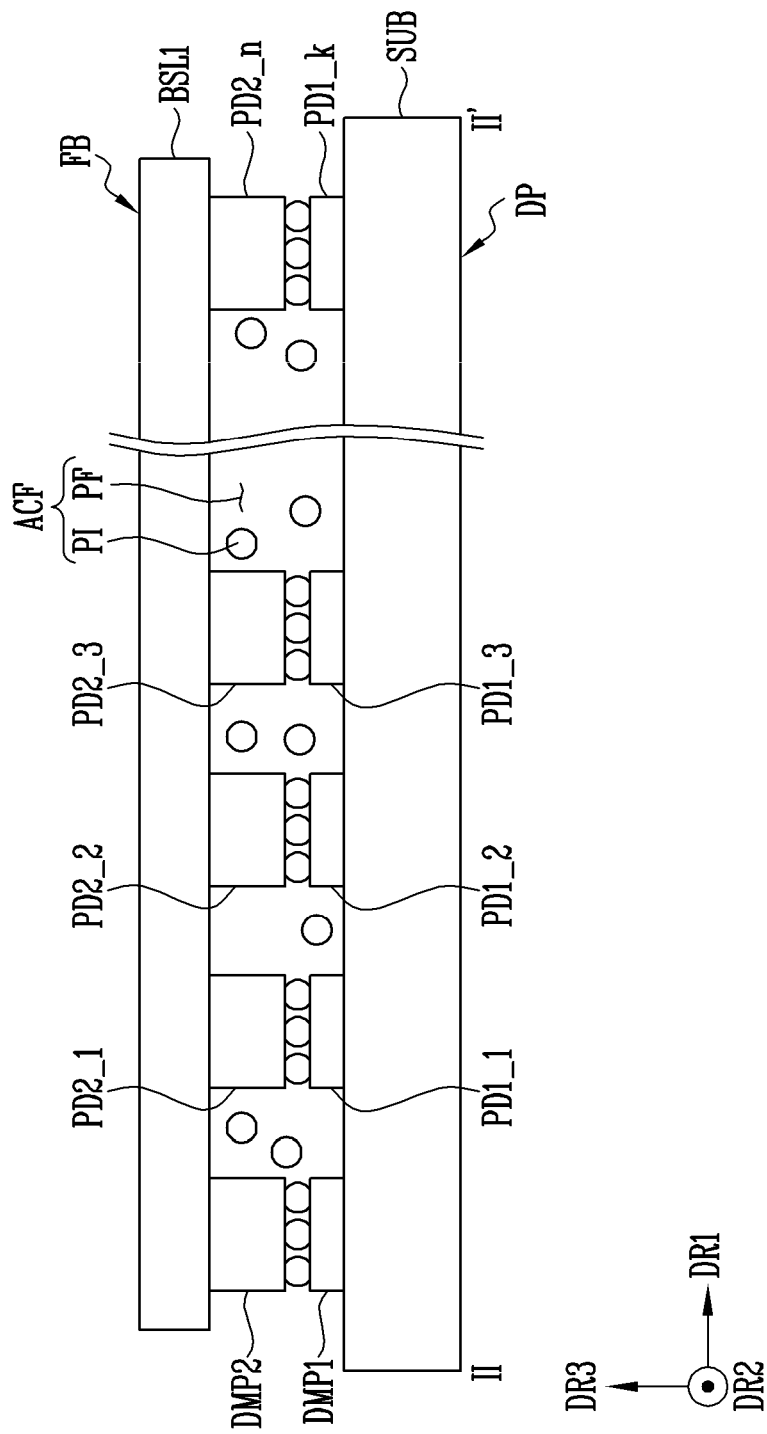

FIG. 16B
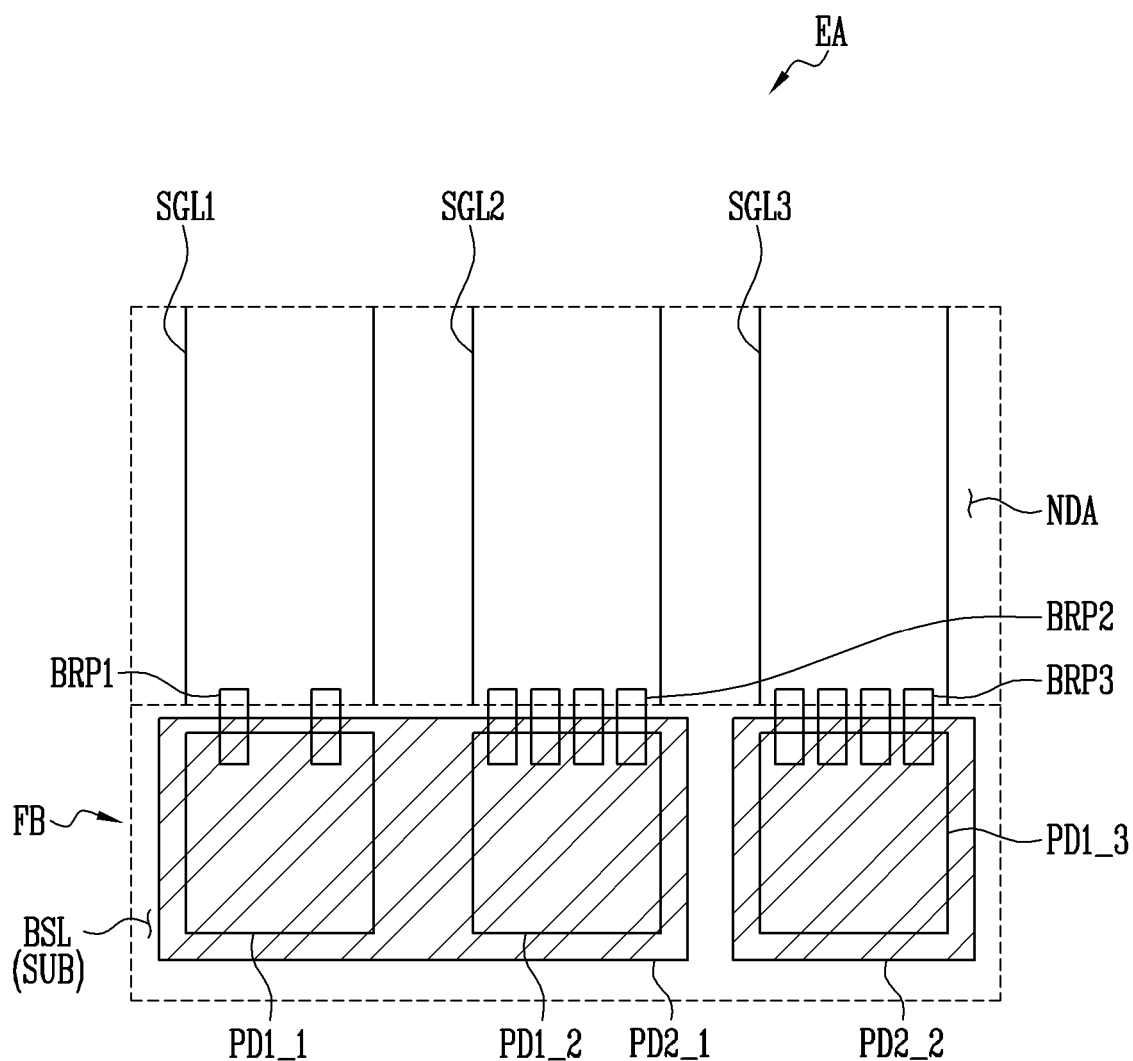
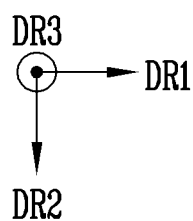

DISPLAY DEVICE INCLUDING A PLURALITY OF LINES TO APPLY DRIVING VOLTAGE TO PIXELS

CROSS-REFERENCE TO RELATED APPLICATION

This application claims priority to and the benefit of Korean patent application number 10-2020-0085516 filed in the Korean Intellectual Property Office on Jul. 10, 2020, the entire disclosure of which is incorporated herein in its entirety by reference.

BACKGROUND

1. Field

Various embodiments of the present disclosure relates to a display device.

2. Description of Related Art

With an increase in interest in an information display and an increase in demand to use portable information media, demand for display devices is markedly increased, and commercialization thereof is in progress.

SUMMARY

Various embodiments of the present disclosure are directed to a display device having improved reliability.

One or more embodiments of the present disclosure may provide a display device including: a substrate including a display area and a non-display area; a plurality of pixels in the display area of the substrate, each of the pixels including a first electrode, a second electrode, a third electrode, and a fourth electrode spaced from each other and a plurality of light emitting elements electrically connected with the first to the fourth electrodes; a plurality of first pads in a pad area of the non-display area of the substrate; a first line, a second line, and a third line in the non-display area of the substrate and configured such that a driving voltage is applied to each of the first to the third lines; and a circuit board to overlap with the pad area of the substrate and including second pads electrically connected with the first pads. The first pads may include a 1-1th pad electrically connected to the first line, a 1-2th pad electrically connected to the second line, and a 1-3th pad electrically connected to the third line. An identical driving voltage may be applied to at least two lines of the first to the third lines. The first to the third lines may apply alignment signals to the first to the fourth electrodes.

In an embodiment, the circuit board may further include a driver including a plurality of output pads electrically connected to the second pads.

In an embodiment, the second pads may include: a 2-1th pad electrically connected with the 1-1th pad; a 2-2th pad electrically connected with the 1-2th pad; and a 2-3th pad electrically connected with the 1-3th pad. The 2-1th and 2-2th pads from among the 2-1th to 2-3th pads may be electrically connected with one output pad of the driver.

In an embodiment, the identical driving voltage may be applied to the 1-1th pad and the 1-2th pad. Here, the identical driving voltage may be applied to the first line and the second line.

In an embodiment, the identical driving voltage to be applied to the first and the second lines may be different from a driving voltage to be applied to the third line. Here, a first driving voltage may be applied to the third line, and a second driving voltage having a second level lower than a first level of the first driving voltage may be applied to the first and the second lines.

In an embodiment, a second pad of the second pads may be electrically connected with the 1-1th and the 1-2th pads. An identical driving voltage may be applied to the 1-1th and the 1-2th pads.

In an embodiment, the display device may further include an anisotropic conductive film between the substrate and the circuit board to electrically connect the first pads and the second pads. The anisotropic conductive film may include: an adhesive film located between the substrate and the circuit board; and conductive particles in the adhesive film to electrically connect the first pads and the second pads.

In an embodiment, each of the pixels may further include a pixel circuit layer on the substrate, the pixel circuit layer including at least one transistor electrically connected with the light emitting elements.

In an embodiment, the light emitting elements may include: first light emitting elements aligned between the first electrode and the second electrode; and second light emitting elements aligned between the third electrode and the fourth electrode.

In an embodiment, the first and the second light emitting elements are aligned, and the first to the fourth electrodes may be electrically connected with the first to the third lines. The alignment signals to be applied to the first to the third lines may be different from each other.

In an embodiment, the first and the second light emitting elements are aligned, and the first to the fourth electrodes may be electrically separated from the first to the third lines.

In an embodiment, each of the pixels may include: a first contact electrode on the first electrode to connect the first electrode with respective first ends of the first light emitting elements; an intermediate electrode on the second and the fourth electrodes to connect respective second ends of the first light emitting elements with respective first ends of the second light emitting elements; and a second contact electrode on the third electrode to connect the third electrode with respective second ends of the second light emitting elements.

In an embodiment, the first contact electrode, the intermediate electrode, and the second contact electrode may be spaced from each other. Here, the intermediate electrode may enclose at least a portion of the second contact electrode in a plan view.

In an embodiment, the first light emitting elements may form a first serial set coupled in parallel between the first electrode and the second electrode. The second light emitting elements may form a second serial set coupled in parallel between the third electrode and the fourth electrode.

In an embodiment, the first electrode may be an anode electrode, and the third electrode may be a cathode electrode.

An embodiment of the present disclosure may provide a display device including: a display panel including a display area in which a plurality of pixels are located, and a non-display area in which a first line, a second, line, and a third line to which a driving voltage is to be applied are located, the non-display area including a pad area in which a plurality of first pads are located; a circuit board in contact with at least one side of the display panel, and including second pads electrically connected with the first pads; a printed circuit board in contact with at least one side of the circuit board; and an anisotropic conductive film located between the display panel and the circuit board and between the circuit board and the printed circuit board. The first pads may include a 1-1th pad electrically connected to the first line, a 1-2th pad electrically connected to the second line, and a 1-3th pad electrically connected to the third line. Each of the pixels may include a first electrode, a second electrode, a third electrode, and a fourth electrode spaced apart from each other, and a plurality of light emitting elements electrically connected with the first to the fourth electrodes. An identical driving voltage may be applied to at least two lines of the first to the third lines. The first to the third lines may apply alignment signals to the first to fourth electrodes.

In a display device in accordance with an embodiment of the present disclosure, an identical driving voltage may be applied to at least two alignment voltage supply lines of first to third alignment voltage supply lines so that the at least two alignment voltage supply lines can be used as power lines for driving pixels, whereby some of the alignment voltage supply lines can be prevented from floating after light emitting elements have been aligned.

The aspects of embodiments of the present disclosure are not limited by the foregoing, and other various aspects are contemplated herein.

BRIEF DESCRIPTION OF THE DRAWINGS

FIGS. 14A and 14B are plan diagrams schematically illustrating a circuit board in accordance with an embodiment of the present disclosure.

FIG. 15 is a schematic sectional view taken along the line II-II' of FIG. 5A.

FIGS. 16A and 16B are schematic plan diagrams showing an enlargement of area EA of FIG. 5A.

DETAILED DESCRIPTION

Figure 1:
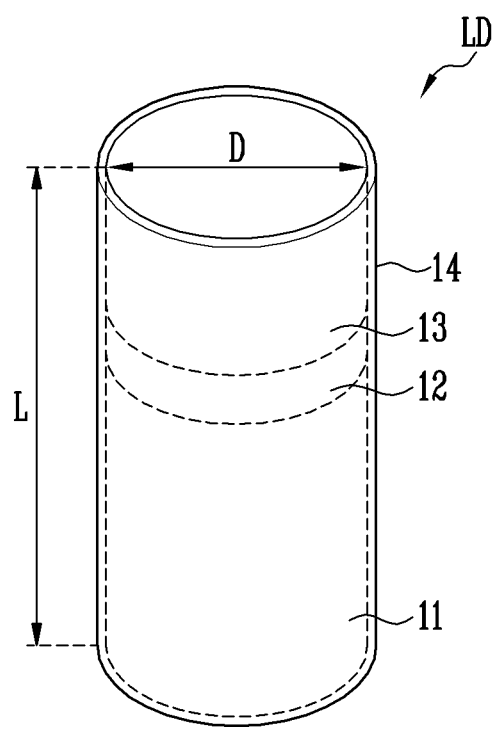
FIG. 1 is a perspective diagram schematically illustrating a light emitting element in accordance with one or more embodiments of the present disclosure.

As the present disclosure allows for various changes and numerous embodiments, example embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this disclosure, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In some cases, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

In one or more embodiments of the present disclosure, a phrase "formed and/or located in (or at) the same layer" may mean that they are formed in the same process and are formed of the same material.

Embodiments and details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural from as long as it is not specifically mentioned in a sentence.

Figure 2:
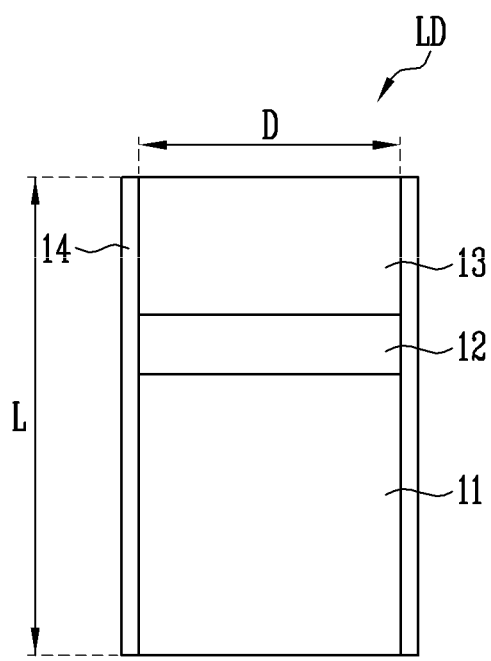
FIG. 2 is a sectional diagram illustrating the light emitting element of FIG. 1.

FIG. 1 is a perspective diagram schematically illustrating a light emitting element in accordance with one or more embodiments of the present disclosure, and FIG. 2 is a sectional diagram of the light emitting element of FIG. 1.

In one or more embodiments of the present disclosure, the type and/or shape of the light emitting element is not limited to the embodiment illustrated in FIGS. 1 and 2.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be implemented as an emissive stack formed by successively stacking the first conductive semiconductor layer 11, the active layer 12, and the second conductive semiconductor layer 13.

The light emitting element LD may be formed in a shape extending in one direction. If the direction in which the light emitting element LD extends is defined as a longitudinal direction, the light emitting element LD may have a first end (or a lower end) and a second end (or an upper end) with respect to the longitudinal direction. Any one semiconductor layer of the first and second semiconductor layers 11 and 13 may be disposed on the first end (or the lower end) of the light emitting element LD. The other semiconductor layer of the first and second semiconductor layers 11 and 13 may be disposed on the second end (or the upper end) of the light emitting element LD. For example, the first semiconductor layer 11 may be disposed on the first end (or the lower end) of the light emitting element LD, and the second semiconductor layer 13 may be disposed on the second end (or the upper end) of the light emitting element LD.

The light emitting element LD may have various shapes. For example, the light emitting element LD may have a rod-like shape or a bar-like shape extending in the longitudinal direction (i.e., to have an aspect ratio greater than 1). In one or more embodiments of the present disclosure, a length L of the light emitting element LD with respect to the longitudinal direction may be greater than a diameter (D, or a width of a cross-section) thereof. The light emitting element LD may include a light emitting diode (LED) fabricated to have a subminiature size, e.g., with a diameter D and/or a length L ranging from a nano scale to a micro scale.

The diameter D of the light emitting element LD may approximately range from about 0.5 µm to about 500 µm, and the length L thereof may approximately range from about 1 µm to about 10 µm. However, the diameter D and the length L of the light emitting element LD are not limited thereto. The size of the light emitting element LD may be changed to meet conditions (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes any one semiconductor material from among InAlGaN, GaN, AlGaN, InGaN, AlN, and InN and is doped with a first conductive dopant (or an n-type dopant) such as Si, Ge, or Sn. However, the material forming the first semiconductor layer 11 is not limited to this, and the first semiconductor layer 11 may be formed of various other materials. In one or more embodiments of the present disclosure, the first semiconductor layer 11 may include gallium nitride (GaN) semiconductor material doped with a first conductive dopant (or an n-type dopant). The first semiconductor layer 11 may include, with regard to the longitudinal direction (L) of the light emitting element LD, an upper surface that comes into contact with the active layer 12, and a lower surface exposed to the outside. The lower surface of the first semiconductor layer 11 may correspond to the first end (or the lower end) of the light emitting element LD.

The active layer 12 may be disposed on the first semiconductor layer 11 and have a single or multiple quantum well structure. For example, in the case where the active layer 12 has a multiple quantum well structure, the active layer 12 may be formed by periodically repeatedly stacking a barrier layer, a strain reinforcing layer, and a well layer which are provided as one unit. The strain reinforcing layer may have a lattice constant less than that of the barrier layer so that strain, e.g., compressive strain, to be applied to the well layer can be further reinforced. However, the structure of the active layer 12 is not limited to that of the foregoing embodiment.

The active layer 12 may emit light having a wavelength ranging from about 400 nm to about 900 nm, and use a double hetero structure. In one or more embodiments of the present disclosure, a clad layer doped with a conductive dopant may be formed on an upper and/or lower portion of the active layer 12 with respect to the longitudinal direction (L) of the light emitting element LD. For example, the cladding layer may be formed of an ALGaN layer or an InALGaN layer. In one or more embodiments, a material such as AlGaN or InAlGaN may be used to form the active layer 12, and various other materials may be used to form the active layer 12. The active layer 12 may include a first surface which comes into contact with the first semiconductor layer 11, and a second surface which comes into contact with the second semiconductor layer 13.

If an electric field having a voltage (e.g., a set voltage or a predetermined voltage) or more is applied between the opposite ends of the light emitting element LD, the light emitting element LD emits light by coupling of electron-hole pairs in the active layer 12. Because, light emission of the light emitting element LD can be controlled based on the foregoing principle, the light emitting element LD may be used as a light source (e.g., a light emitting source) of various light emitting devices as well as a pixel of the display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes any one semiconductor material from among InAlGaN, GaN, AlGaN, InGaN, AlN, and InN, and is doped with a second conductive dopant (or a p-type dopant) such as Mg. However, the material for forming the second semiconductor layer 13 is not limited to this, and the second semiconductor layer 13 may be formed of various other materials. In one or more embodiments of the present disclosure, the second semiconductor layer 13 may include gallium nitride (GaN) semiconductor material doped with a second conductive dopant (or a p-type dopant). The second semiconductor layer 13 may include, with regard to the longitudinal direction (L) of the light emitting element LD, a lower surface that comes into contact with the second surface of the active layer 12, and an upper surface exposed to the outside. Here, the upper surface of the second semiconductor layer 13 may correspond to the second end (or the upper end) of the light emitting element LD.

In one or more embodiments of the present disclosure, the first semiconductor layer 11 and the second semiconductor layer 13 may have different thicknesses with respect to the longitudinal direction (L) of the light emitting element LD. For example, the first semiconductor layer 11 may have a thickness greater than that of the second semiconductor layer 13 with respect to the longitudinal direction (L) of the light emitting element LD. Hence, the active layer 12 of the light emitting element LD may be disposed at a position closer to an upper surface of the second semiconductor layer 13 than to a lower surface of the first semiconductor layer 11.

Although the first semiconductor layer 11 and the second semiconductor layer 13 each is formed of a single layer, the present disclosure is not limited thereto. In one or more embodiments of the present disclosure, depending on the material of the active layer 12, the first semiconductor layer 11 and the second semiconductor layer 13 each may further include at least one or more layers, for example, a clad layer and/or a tensile strain barrier reducing (TSBR) layer. The TSBR layer may be a strain relief layer of which a lattice structure is disposed between other semiconductor layers so that the strain relief layer functions as a buffer layer to reduce a difference in lattice constant. Although the TSBR layer may be formed of a p-type semiconductor layer such as p-GaInP, p-AlInP, or p-AlGaInP, the present disclosure is not limited thereto.

In some embodiments of the present disclosure, the light emitting element LD may further include an additional electrode (hereinafter referred to as 'first additional electrode') disposed on the second semiconductor layer 13 (e.g., the upper end of the light emitting element LD), as well as including the first semiconductor layer 11, the active layer 12, and the second semiconductor layer 13. Furthermore, in one or more embodiments, the light emitting element LD may further include another additional electrode (hereinafter referred to as 'second additional electrode') disposed on the first end of the first semiconductor layer 11 (e.g., the lower end of the light emitting element LD).

Each of the first and second additional electrodes may be an ohmic contact electrode, but the present disclosure is not limited thereto. In one or more embodiments, each of the first and second additional electrodes may be a Schottky contact electrode. The first and second additional electrodes may include conductive material. For example, the first and second additional electrodes may include opaque metal such as chrome (Cr), titanium (Ti), aluminum (Al), gold (Au), nickel (Ni), and oxides or alloys thereof, which are used alone or in combination, but the present disclosure is not limited thereto. In one or more embodiments, the first and second additional electrodes may also include transparent conductive oxides such as indium tin oxide (ITO), indium zinc oxide (IZO), zinc oxide (ZnO), indium gallium zinc oxide (IGZO), and indium tin zinc oxide (ITZO).

Materials included in the first and second additional electrodes may be equal to or different from each other. The first and second additional electrodes may be substantially transparent or translucent. Therefore, light generated from the light emitting element LD may pass through the first and second additional electrodes and then be emitted outside the light emitting element LD. In some embodiments, in the case where light generated from the light emitting element LD is emitted outside the light emitting element LD through a region other than the opposite ends of the light emitting element LD rather than passing through the first and second additional electrodes, the first and second additional electrodes may include opaque metal.

In some embodiments of the present disclosure, the light emitting element LD may further include an insulating layer 14. However, in some embodiments of the present disclosure, the insulating layer 14 may be omitted, or may be provided to cover only some of the first semiconductor layer 11, the active layer 12, the second semiconductor layer 13 and/or the first and second additional electrodes.

The insulating layer 14 may prevent the active layer 12 from short-circuiting due to making contact with conductive material except the first and second semiconductor layers 11 and 13. Furthermore, the insulating layer 14 may reduce or minimize a surface defect of the light emitting element LD, thus enhancing the lifetime of the light emitting element LD and the emission efficiency thereof. In the case where a plurality of light emitting elements LD are disposed in close contact with each other, the insulating layer 14 may prevent undesired short-circuit between adjacent light emitting elements LD. Whether the insulating layer 14 is provided is not limited so long as the active layer 12 can be prevented from short-circuiting with external conductive material (e.g., the pixel electrodes, semiconductor layers of the adjacent light emitting elements LD).

The insulating layer 14 may be provided to enclose an overall outer peripheral surface (e.g., an overall outer circumferential surface) of the emission stack including the first semiconductor layer 11, the active layer 12, and the second semiconductor layer 13.

Although in the foregoing embodiment, the insulating layer 14 has been described as enclosing the entirety of the respective outer peripheral surfaces (e.g., outer circumferential surfaces) of the first semiconductor layer 11, the active layer 12, the second semiconductor layer 13, the present disclosure is not limited thereto. In one or more embodiments, in the case where the light emitting element LD includes the first additional electrode, the insulating layer 14 may enclose the entirety of the respective outer peripheral surface (e.g., outer circumferential surfaces) of the first semiconductor layer 11, the active layer 12, the second semiconductor layer 13, and the first additional electrode. In one or more embodiments, the insulating layer 14 may not enclose the entirety of the outer peripheral surface (e.g., the outer circumferential surface) of the first additional electrode, or may enclose only a portion of the outer peripheral surface (e.g., the outer circumferential surface) of the first additional electrode but not enclose the other portion of the outer peripheral surface (e.g., the outer circumferential surface) of the first additional electrode. Furthermore, in some embodiments, in the case where the first additional electrode is disposed on the second end (or the upper end) of the light emitting element LD and the second additional electrode is disposed on the first end (or the lower end) of the light emitting element LD, the insulating layer 14 may allow at least one area of each of the first and second additional electrodes to be exposed.

The insulating layer 14 may include transparent insulating material. For example, the insulating layer 14 may include at least one insulating material selected from the group consisting of silicon oxide (SiOx), silicon nitride (SiNx), silicon oxynitride (SiOxNy), aluminum oxide (AlOx), and titanium dioxide (TiOx), but the present disclosure is not limited thereto. Various materials having insulation may be used as the material of the insulating layer 14. The insulating layer 14 may be provided in the form of a single-film or in the form of a multi-film including at least two films.

In some embodiments, the light emitting element LD may be implemented as a light emitting pattern having a core-shell structure. In such a case, the first semiconductor layer 11 may be disposed in a core of the light emitting element LD, i.e., a central portion of the light emitting element LD. The active layer 12 may be provided and/or formed to enclose the outer peripheral surface (e.g., the outer circumferential surface) of the first semiconductor layer 11. The second semiconductor layer 13 may be provided and/or formed to enclose the active layer 12 along the outer peripheral surface (e.g., the outer circumferential surface) of the active layer 12. Furthermore, the light emitting element LD may further include an additional electrode formed to enclose at least one side of the second semiconductor layer 13 along the outer peripheral surface (e.g., the outer circumferential surface) of the second semiconductor layer 13. In one or more embodiments, the light emitting element LD may further include an insulating layer 14 that is provided on the outer peripheral surface (e.g., the outer circumferential surface) of the light emitting pattern having a core-shell structure and has transparent insulating material. The light emitting element LD implemented as the light emitting pattern having the core-shell structure may be manufactured in a growth manner.

The light emitting element LD may be employed as a light source for various display devices. The light emitting element LD may be fabricated through a surface treatment process. For example, the light emitting element LD may be surface-treated so that, when a plurality of light emitting elements LD are mixed with a fluidic solution (or solvent) and then supplied to each pixel area (e.g., an emission area of each pixel or an emission area of each sub-pixel), the light emitting diodes LD can be evenly distributed between the two adjacent pixel electrodes having different polarities, rather than unevenly aggregating in the solution.

A light emitting unit (or a light emitting device) including the light emitting element LD described above may be used in various types of devices including a display device which requires a light source. For instance, in the case where a plurality of light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which requires a light source.

Figure 3:
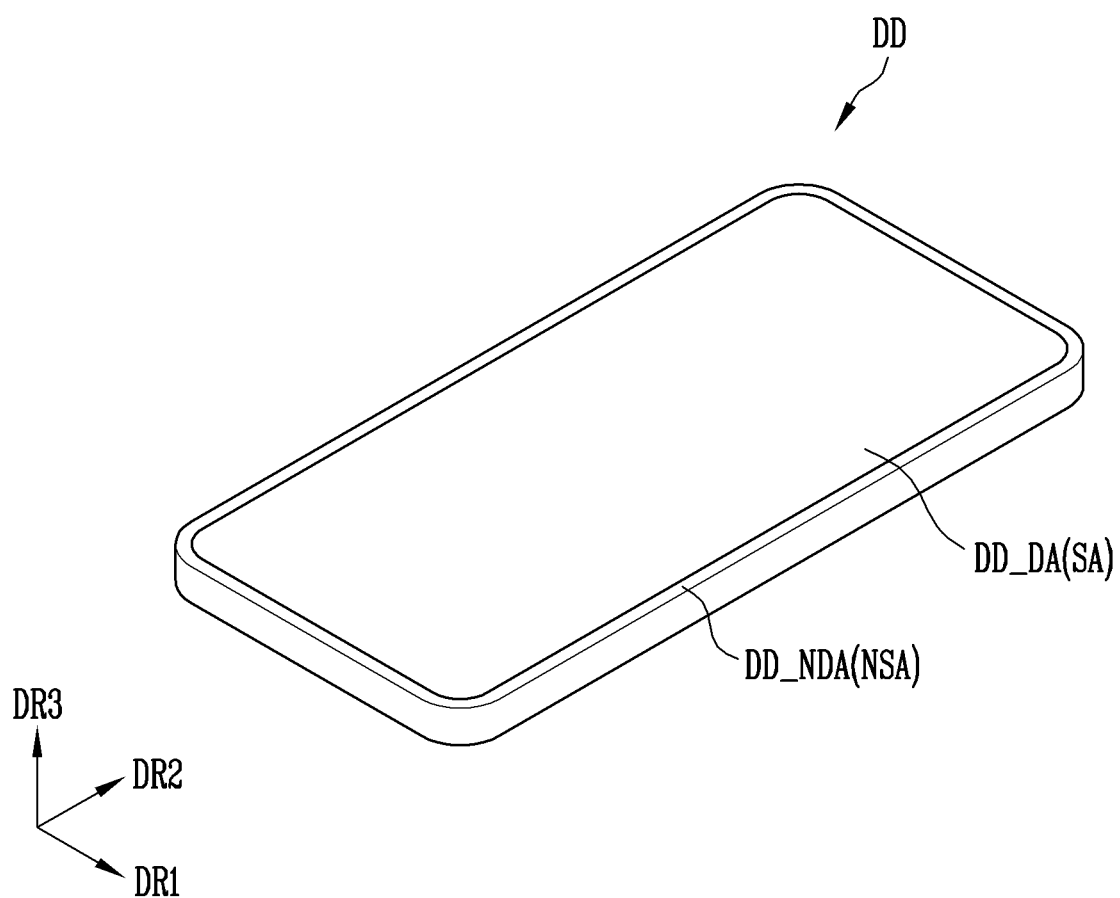
FIG. 3 illustrates a display device in accordance with one or more embodiments of the present disclosure, and is a schematic perspective diagram illustrating a display device using the light emitting element illustrated in FIG. 1 as a light emitting source.
Figure 4:
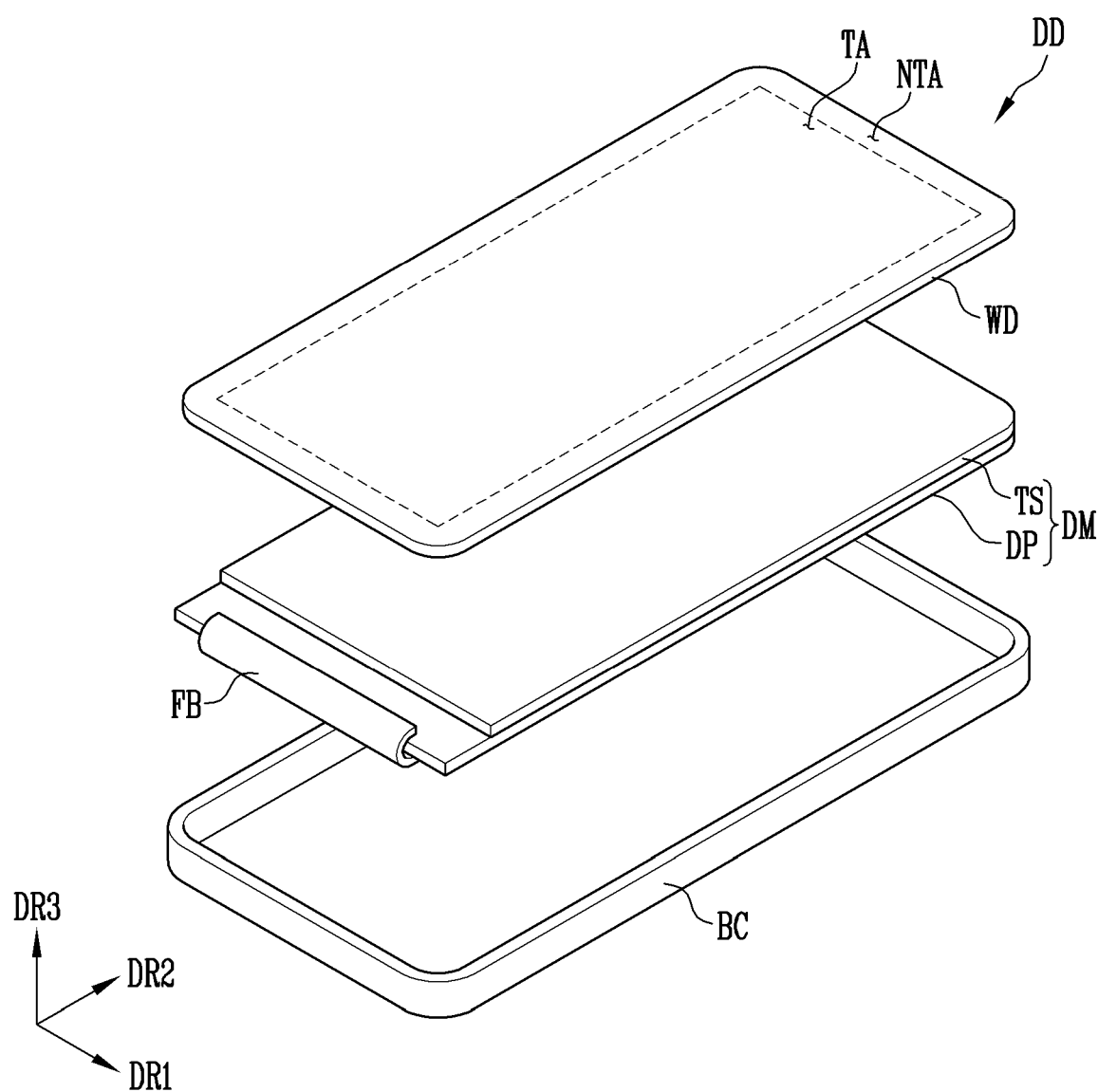
FIG. 4 is a schematic exploded perspective diagram illustrating the display device of FIG. 3.

FIG. 3 illustrates a display device in accordance with an embodiment of the present disclosure, and is a schematic perspective diagram illustrating a display device using the light emitting element illustrated in FIG. 1 as a light source. FIG. 4 is a schematic exploded perspective diagram of the display device of FIG. 3.

Referring to FIGS. 1-4, the display device DD may display an image on a display surface, e.g., a display area DD_DA.

If the display device DD is an electronic device having a display surface on at least one surface thereof, e.g., a smartphone, a television, a tablet PC, a mobile phone, a video phone, an electronic reader, a desktop PC, a laptop PC, a netbook computer, a workstation, a server, a PDA, a portable multimedia player (PMP), an MP3 player, a medical appliance, a camera, or a wearable device, the present disclosure may be applied to the display device DD.

The display device may be classified into a passive matrix type display device and an active matrix type display device according to a method of driving the light emitting element LD. For example, in the case where the display device in accordance with an embodiment is implemented as an active matrix type, each of the pixels PXL may include a driving transistor configured to control the amount of current to be supplied to the light emitting element LD, and a switching transistor configured to transmit data signals to the driving transistor.

The display device DD may be provided in various forms, for example, in the form of a rectangular plate having two pairs of parallel sides, but the present disclosure is not limited thereto. In the case where the display device DD is provided in the form of a rectangular plate, one pair of sides of the two pairs of sides may be longer than the other. In some embodiments of the present disclosure, for the sake of explanation, there is illustrated an example in which the display device DD has a rectangular form with a pair of long sides and a pair of short sides. The direction in which the long sides extend refers to a second direction DR2, the direction in which the short sides extend refers to a first direction DR1, and the direction perpendicular to the long sides and the short sides refers to a third direction DR3. As described above, in the display device DD provided in the form of a rectangular plate, a corner where one long side and one short side meet may have a round shape (i.e., a rounded shape or a curvature).

In some embodiments of the present disclosure, at least a portion of the display device DD may have flexibility, and the display device may fold at the portion having the flexibility.

The display device DD may include a display area DD_DA provided to display an image, and a non-display area DD_NDA provided on at least one side of the display area DD_DA. The non-display area DD_NDA may be an area on which an image is not displayed. In some embodiments, the non-display area DD_NDA may surround the display area DD_DA along the edge or periphery of the display area DD_DA.

In some embodiments, the display device DD may include a sensing area SA and a non-sensing area NSA. The display device DD may not only display an image through the sensing area SA but may also sense light that is incident from the front. Although the non-sensing area NSA may enclose the sensing area SA along the edge or periphery of the sensing area SA, this is only for illustrative purposes, and the present disclosure is not limited thereto. Although FIG. 3 illustrates that the sensing area SA includes corners each having a round shape (i.e., a rounded shape or a curvature) and corresponds to the display area DD_DA, the present disclosure is not limited thereto. In some embodiments, a portion of the display area DA may correspond to the sensing area SA.

The shape, the size, and the disposition location of the sensing area SA of the display device DD may be changed in various ways.

The display device DD may include a window WD, a display module DM, a circuit board FB, and a receiving component BC.

The window WD may be disposed over the display module DM to protect the display module DM from an external shock and allow an image provided from the display module DM to pass through a transmission area TA. The window WD may include the transmission area TA and a non-transmission area NTA. In some embodiments, the non-transmission area NTA may surround the transmission area TA along the edge or periphery of the transmission area TA.

The transmission area TA may have a shape corresponding to the display area DD-DA illustrated in FIG. 3. In other words, an image displayed on the display area DD-DA of the display device DD may be visible from the outside through the transmission area TA of the window WD.

The non-transmission area NTA may have a shape corresponding to the non-display area DD-NDA illustrated in FIG. 3. The non-transmission area NTA may be an area having optical transmittance lower than that of the transmission area TA. However, the present disclosure is not limited thereto, and the non-transmission area NTA may be omitted.

The window WD may have a multilayer structure including at least one selected from among a glass substrate, a plastic film, and a plastic substrate. The multilayer structure may be formed through a continuous process or an adhesion process using an adhesive layer. The window WD may entirely or partially have flexibility.

The display module DM may be disposed between the window WD and the receiving component BC. The display module DM may include a display panel DP and a touch sensor TS.

The display panel DP may display an image. A self-emissive display panel, such as an organic light emitting diode (OLED) display panel (e.g., an OLED panel) using an organic light emitting diode as a light emitting element, a nano-scale light emitting diode (LED) display panel using a nano-scale LED as the light emitting element LD, as illustrated in FIGS. 1 and 2, or a quantum dot organic light emitting display panel (QD OLED panel) using a quantum dot and an organic light emitting diode, may be used as the display panel DP. In some embodiments, a non-emissive display panel such as a liquid crystal display (LCD) panel, an electro-phoretic display (EPD) panel, or an electro-wetting display (EWD) panel may be used as the display panel DP. In the case where the non-emissive display panel is used as the display panel DP, the display device DD may include a backlight unit configured to supply light to the display panel DP.

Hereinafter, the display panel DP in accordance with the present disclosure may be described as being a subminiature (e.g., micro-scale or nano-scale) LED display panel. However, the present disclosure is not limited thereto. In some embodiments, various display panels may be applied to the present disclosure.

The touch sensor TS may be disposed between the window WD and the display panel DP. The touch sensor TS may sense an input applied from the outside. The input applied from the outside may be provided in various manners. For example, external inputs may include various types of external inputs using a part of the body of a user, a stylus pen, light, heat, pressure, etc. Furthermore, not only an input formed by making contact with a part of the body such as the hand of the user, but also an input formed by an approach or an adjacent space touch (e.g., hovering) may be a type of input.

The touch sensor TS may be directly disposed on the display panel DP. In the present embodiment, the touch sensor TS may be manufactured through a process successive to that of the display panel DP. However, the present disclosure is not limited thereto, and the touch sensor TS may be provided as an individual panel and coupled with the display panel DP by an adhesive. In some embodiments, the touch sensor TS may be omitted.

The circuit board FB may be coupled to one end of the display panel DP and provide a driving signal and a voltage (e.g., a set or predetermined voltage) to the display panel DP. For example, the driving signal may be a signal to be used to display an image on the display panel DP, and the voltage (e.g., the predetermined voltage) may be a driving voltage needed to drive the display panel DP. Although FIG. 4 illustrates the structure in which the circuit board FB is coupled to the display panel DP, the present disclosure is not limited thereto. The display device DD may further include a touch circuit board coupled to the touch sensor TS. The touch circuit board may provide a touch driving signal to the touch sensor TS. Furthermore, a bonding method of coupling the circuit board FB to the display panel DP in accordance with the present disclosure may be substantially the same as a bonding method of coupling the touch circuit board to the touch sensor TS.

The receiving component BC may be coupled with the window WD. The receiving component BC may provide a rear surface of the display device DD and may be coupled with the window WD to define an internal space. The receiving component BC may include material having relatively high stiffness For example, the receiving component BC may include a plurality of frames and/or plates formed of glass, plastic, or metal. The receiving component BC may reliably protect the components of the display device DD received in the internal space from external shocks. Although the receiving component has been described as having relatively high stiffness, the present disclosure is not limited thereto, and the receiving component BC may include flexible material. Although not illustrated, the display device DD in accordance with an embodiment of the present disclosure may have foldable or bendable characteristics. As a result, the components included in the display device DD may also have flexible characteristics.

Figure 5A:
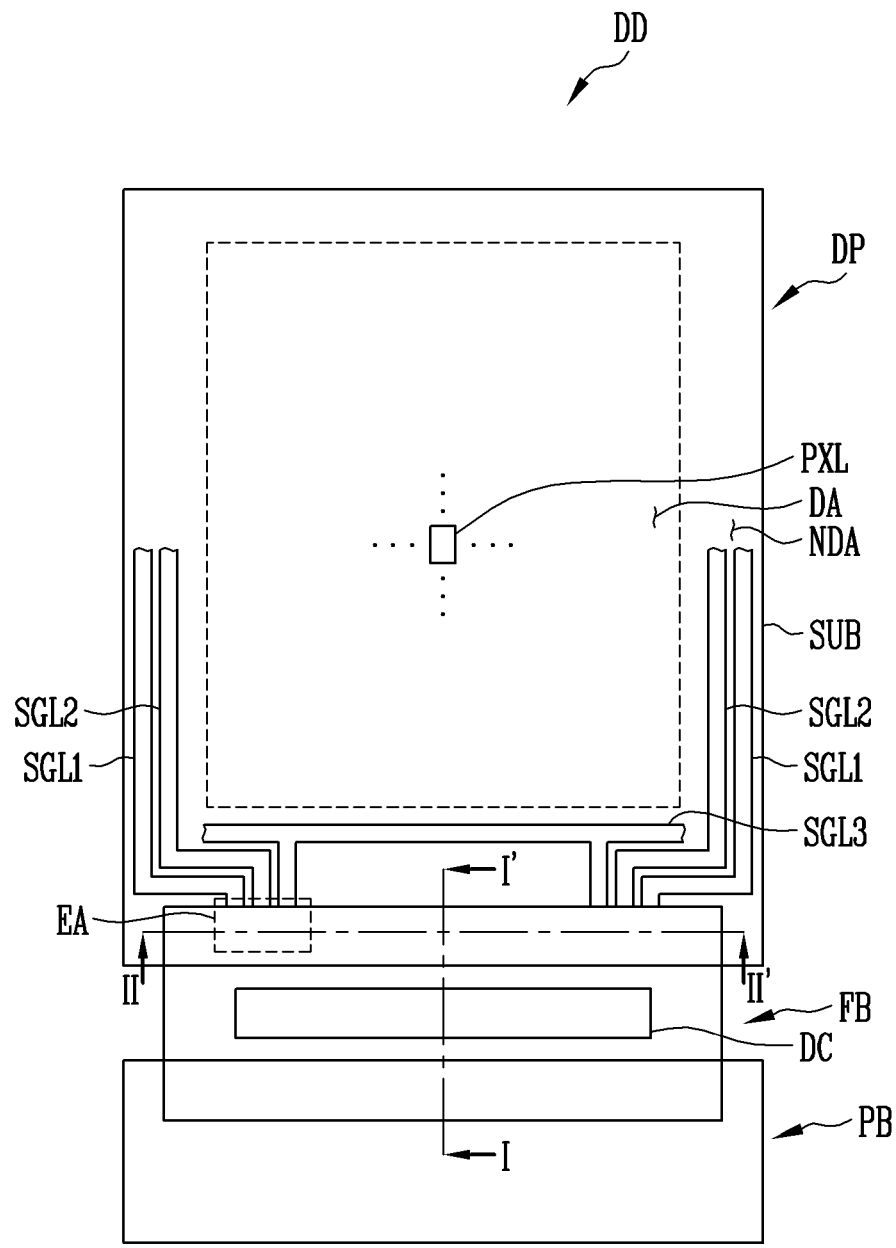
FIGS. 5A and 5B are schematic plan diagrams illustrating a display device in accordance with one or more embodiments of the present disclosure.
Figure 5B:
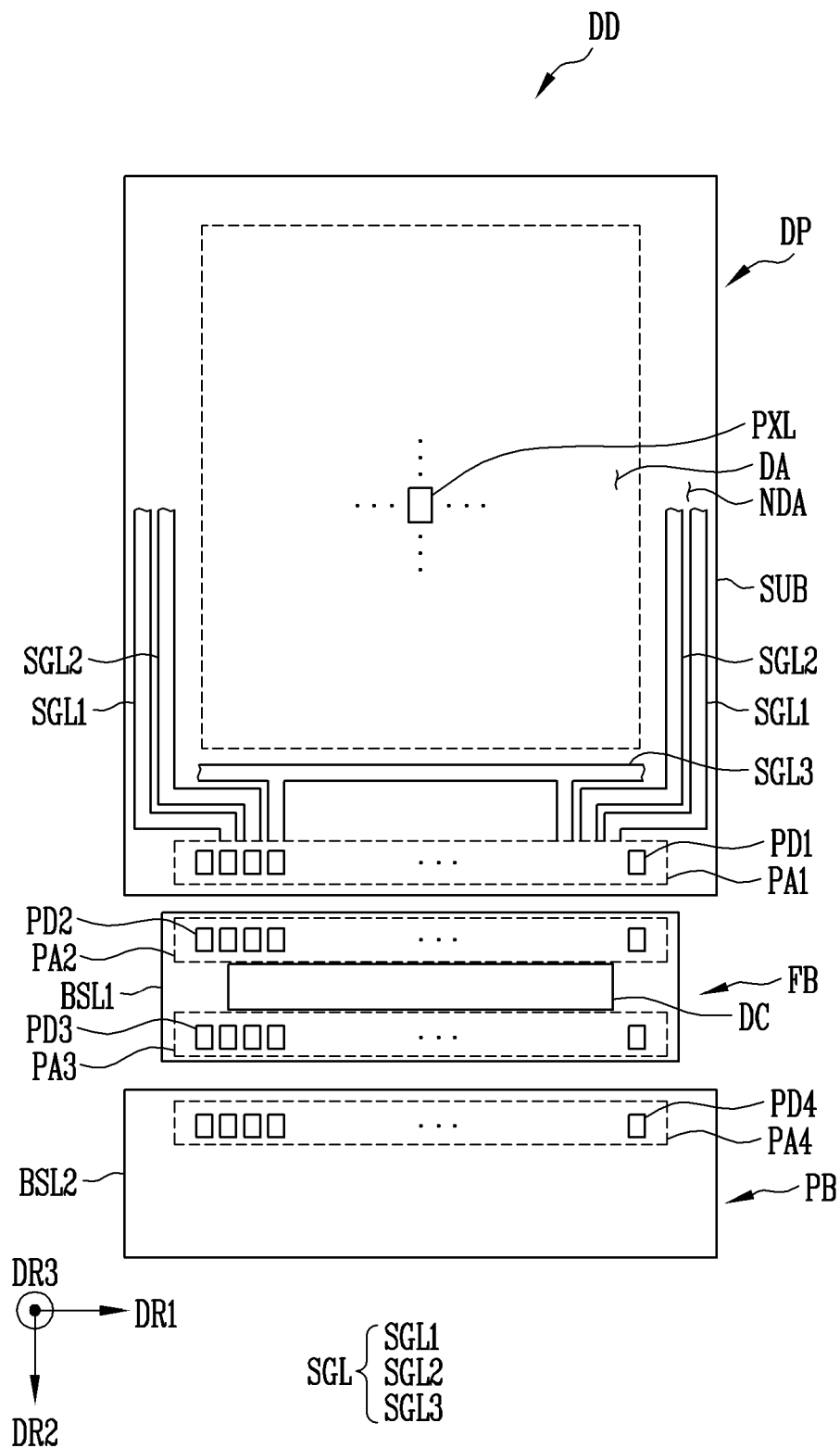
Figure 6:
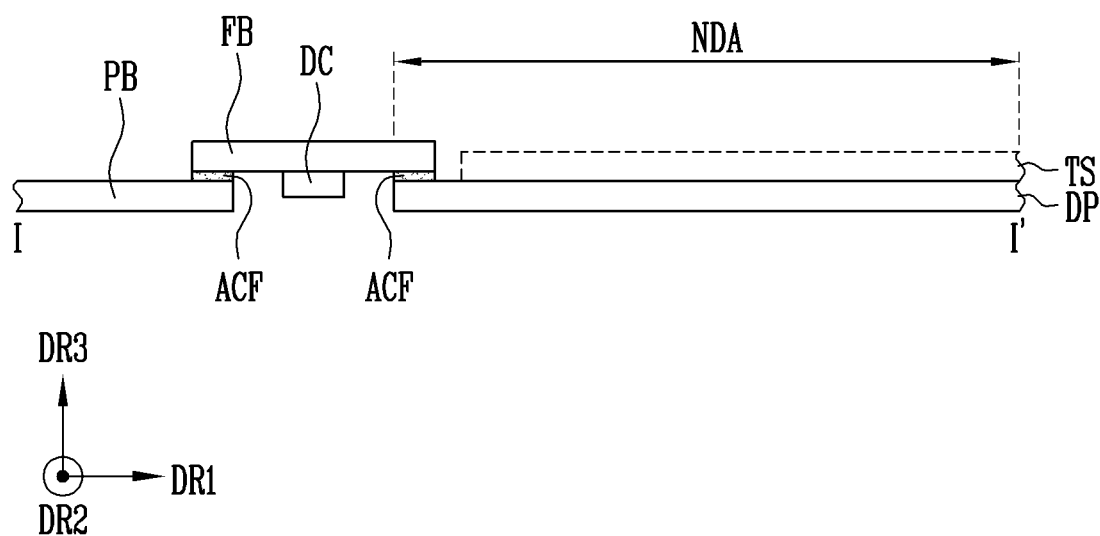
FIG. 6 is a schematic sectional diagram taken along the line I-I' of FIG. 5A.

FIGS. 5A and 5B are schematic plan diagrams illustrating a display device in accordance with one or more embodiments of the present disclosure. FIG. 6 is a schematic sectional diagram taken along the line I-I' of FIG. 5A.

Referring to FIGS. 1, 2, and 5A-6, the display device DD may include a display panel DP, a circuit board FB, and a printed circuit board PB.

The display panel DP may include a substrate SUB, and a plurality of pixels PXL provided on the substrate SUB.

The substrate SUB may include a display area DA and a non-display area NDA. The display area DA may be an area in which the pixels PXL for displaying an image are provided. A line component electrically connected with the pixels PXL may be disposed in the non-display area NDA. The non-display area NDA may include a first pad area PA1. A plurality of first pads PD1 may be disposed in the first pad area PA1. For the convenience sake, FIGS. 5A and 5B illustrate one pixel PXL, but a plurality of pixels PXL may be substantially provided in the display area DA of the substrate SUB.

The non-display area NDA may be provided on at least one side of the display area DA. The non-display area NDA may enclose the perimeter (or edges) of the display area DA.

The substrate SUB may include transparent insulating material to allow light transmission. The substrate SUB may be a rigid substrate or a flexible substrate.

An area on the substrate SUB is provided as the display area DA in which the pixels PXL are disposed, and the other area thereof is provided as the non-display area NDA. For example, the substrate SUB may include the display area DA including a plurality of pixel areas on which the respective pixels PXL are disposed, and the non-display area NDA disposed around the perimeter of the display area DA (or adjacent to the display area DA).

The pixels PXL may be disposed in the display area DA on the substrate SUB. In some embodiments of the present disclosure, the pixels PXL may be arranged in the display area DA in a stripe arrangement structure or a PENTILE® arrangement structure. This pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the present disclosure is not limited thereto.

Each of the pixels PXL may include at least one light emitting element LD configured to be driven in response to a corresponding scan signal and a corresponding data signal. The light emitting element LD may have a small size ranging from a nanoscale to a microscale and may be coupled in parallel to light emitting elements LD disposed adjacent thereto, but the present disclosure is not limited thereto. The light emitting element LD may form a light source of the corresponding pixel PXL.

Each of the pixels PXL may include at least one light source, e.g., the light emitting element LD illustrated in FIG. 1, which is driven by a signal (e.g., a set or predetermined signal (e.g., a scan signal and a data signal)) and/or a power supply (e.g., a set or predetermined power supply (e.g., a first driving power supply and a second driving power supply)). However, in embodiments of the present disclosure, the type of the light emitting element LD which may be used as a light source of each of the pixels PXL is not limited thereto.

The line component may electrically connect a driver, e.g., the circuit board FB, with the pixels PXL. The line component may include a fan-out line connected with signal lines, e.g., a scan line, a data line, and an emission control line, which are connected to each pixel PXL to provide signals to the pixel PXL. Furthermore, the line component may further include a fan-out line connected to signal lines, e.g., a control line, and a sensing line, which are connected to each pixel PXL to compensate in real time for variation in electrical characteristics of the pixel PXL. Furthermore, the line component may further include driving voltage supply lines SGL configured to apply a driving voltage to the pixels PXL.

The driving voltage supply lines SGL may include first to third driving voltage supply lines SGL1 to SGL3. The same driving voltage may be applied to at least two driving voltage supply lines from among the first to third driving voltage supply lines SGL1 to SGL3. For example, the same driving voltage may be applied to the first and second driving voltage supply lines SGL1 and SGL2 from among the first to third driving voltage supply lines SGL1 to SGL3. A driving voltage different from the driving voltage to be applied to the first and second driving voltage supply lines SGL1 and SGL2 may be applied to the third driving voltage supply line SGL3. In some embodiments of the present disclosure, the driving voltage supply lines SGL may be used as alignment signal supply lines configured to supply, when light emitting elements LD are aligned in each pixel PXL, an alignment signal (or an alignment voltage) to the corresponding pixel PXL. This will be described in detail later herein.

In some embodiments, the touch sensor TS may be provided on the display panel DP.

The circuit board FB may be coupled to one end of the display panel DP and one end of the printed circuit board PB. In some embodiments, the circuit board FB may be provided as a flexible printed circuit board (FPCB). For example, as illustrated in FIG. 4, the circuit board FB may be folded along one side surface of the display panel DP and disposed on the rear surface of the display panel DP.

The circuit board FB may process various signals input from the printed circuit board PB and output the processed signals to the display panel DP. To this end, one end of the circuit board FB may be attached to the display panel DP, and the other end thereof opposite to the one end may be attached to the printed circuit board PB. The circuit board FB may be coupled to each of the display panel DP and the printed circuit board PB by a conductive adhesive. The conductive adhesive may include an anisotropic conductive film ACF. Hereinafter, the conductive adhesive will be described as being an anisotropic conductive film ACF.

The circuit board FB may include a first base layer BSL1 and a plurality of second pads PD2. The second pads PD2 may be disposed in a second pad area PA2 defined on the first base layer BSL1. In the case where the circuit board FB and the display panel DP are bonded to each other, the first pad area PA1 and the second pad area PA2 may overlap with each other.

The second pads PD2 may be electrically connected with the first pads PD1 disposed in the first pad area PA1 of the display panel DP. As a result, a plurality of signals transmitted from the second pads PD2 may be transmitted to the pixels PXL through the first pads PD1. The first pads PD1 may be electrically connected with the second pads PD2 of the circuit board FB through an anisotropic conductive film ACF. However, the present disclosure is not limited thereto (e.g., see, FIG. 6). In some embodiments, the first pads PD1 may be electrically connected with the second pads PD2 of the circuit board FB by an ultrasonic bonding method or the like.

The circuit board FB may include a plurality of third pads PD3 disposed on the first base layer BSL1. A third pad area PA3 overlapping with a fourth pad area PA4 of the printed circuit board PB may be defined in the circuit board FB. The third pads PD3 may be disposed on the first base layer BSL1 at positions corresponding to the third pad area PA3. When the circuit board FB and the printed circuit board PB are bonded to each other, the third pad area PA3 and the fourth pad area PA4 defined in the printed circuit board PB may overlap with each other.

In a plan view, the third pads PD3 may be spaced from the second pads PD2 with a driver DC interposed therebetween. Here, the driver DC may be an integrated circuit (IC).

The driver DC may be electrically connected with the second pads PD2 and the third pads PD3. The driver DC may receive driving signals output from the printed circuit board PB through the third pads PD3, and output signals (e.g., set or predetermined signals) and driving voltage (e.g., set or predetermined driving voltage) (or driving power) to be provided to the pixels PXL based on the received driving signals. The signals (e.g. the set or predetermined signals) and the driving voltage (e.g., the set or predetermined driving voltage) (or the driving power) may be transmitted, through the second pads PD2, to the corresponding first pads PD1.

In the foregoing embodiment, the driver DC has been described as being disposed on the circuit board FB, but the present disclosure is not limited thereto. In some embodiments, the driver DC may be disposed (or mounted) on the substrate SUB of the display panel DP.

The printed circuit board PB may generate overall driving signals and power supply signals needed for driving the display panel DP and the driving signals and the power supply signals to the display panel DP. The printed circuit board PB may include a second base layer BSL2 and fourth pads PD4. The fourth pads PD4 may be disposed in the fourth pad area PA4 defined on the second base layer BSL2.

The fourth pads PD4 may be electrically connected with the third pads PD3 disposed in the third pad area PA3 of the circuit board FB. As a result, a plurality of driving signals and power supply signals that are transmitted from the fourth pads PD4 may be transmitted to the driver DC through the third pads PD3. Although the fourth pads PD4 may be electrically connected with the third pads PD3 of the circuit board FB through an anisotropic conductive film ACF, the present disclosure is not limited thereto. In some embodiments, the fourth pads PD4 may be electrically connected with the third pads PD3 of the circuit board FB by an ultrasonic bonding method or the like.

Figure 7:
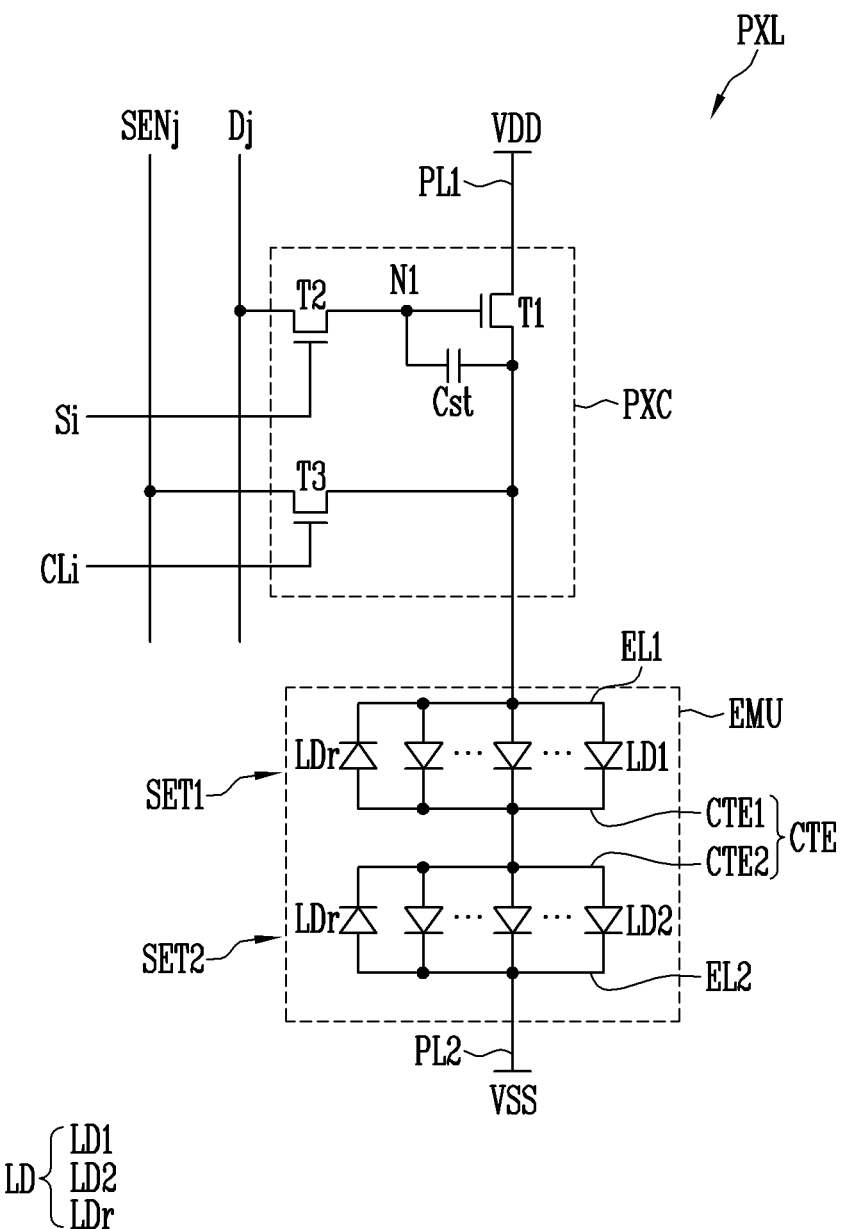
FIG. 7 is a circuit diagram illustrating one or more embodiments of electrical connection relationship of components included in each pixel illustrated in FIGS. 5A and 5B.

FIG. 7 is a circuit diagram illustrating one or more embodiments of electrical connection relationship of components included in each pixel illustrated in FIGS. 5A and 5B.

For example, FIG. 7 illustrates different electrical connection relationship of components included in a pixel PXL which may be employed in an active display device in accordance with one or more embodiments. However, the types of the components included in the pixel PXL to which embodiments of the present disclosure may be applied are not limited thereto.

In FIG. 7, not only the components included in each of the pixels illustrated in FIGS. 5A and 5B but also an area in which the components are provided is embraced in the definition of the term "pixel PXL".

Referring to FIGS. 1-7, each pixel PXL (hereinafter, referred to as 'pixel') may include an emission unit EMU configured to generate light having a luminance corresponding to a data signal. Furthermore, the pixel PXL may selectively further include a pixel circuit PXC configured to drive the emission unit EMU.

The pixel circuit PXC may be connected to a scan line Si and a data line Dj of the corresponding pixel PXL. For example, in the case where the pixel PXL is disposed on an ith row (i is a natural number) and a jth column (j is a natural number) of the display area DA, the pixel circuit PXC of the pixel PXL may be connected to an ith scan line Si and a jth data line Dj of the display area DA. Furthermore, the pixel circuit PXC may be connected to an ith control line CLi and a jth sensing line SENj of the display area DA.

The pixel circuit PXC may include first to third transistors T1 to T3, and a storage capacitor Cst.

The second transistor (e.g., T2; the switching transistor) may include a first terminal connected to the jth data line Dj, and a second terminal connected to a first node N1. Here, the first terminal and the second terminal of the second transistor T2 are different from each other, and, for example, if the first terminal is a drain electrode, and the second terminal is a source electrode. A gate electrode of the second transistor T2 may be connected to the ith scan line Si.

When a scan signal having a voltage (e.g., a high-level voltage) capable of turning on the second transistor T2 is supplied from the ith scan line Si, the second transistor T2 is turned on to electrically connect the jth data line Dj with the first node N1. Here, a data signal of a corresponding frame is supplied to the jth data line Dj, whereby the data signal is transmitted to the first node N1. The data signal transmitted to the first node N1 may be charged into the storage capacitor Cst. In other words, the storage capacitor Cst may store a charge corresponding to the data signal transmitted to the first node N1.

The first transistor (e.g., T1; the driving transistor) may include a first terminal connected to the first driving power supply VDD, and a second terminal electrically connected to the first electrode EL1 for the light emitting elements LD. A gate electrode of the first transistor T1 may be connected to a first node N1. The first transistor T1 may control the amount of driving current to be supplied to the light emitting elements LD in response to the voltage of the first node N1.

The third transistor T3 may be coupled between the first transistor T1 and the jth sensing line SENj. For example, a first terminal of the third transistor T3 may be connected to the second terminal of the first transistor T1 connected to the first electrode EL1. A second terminal of the third transistor T3 may be connected to the jth sensing line SENj. A gate electrode of the third transistor T3 may be connected to the ith control line CLi. The third transistor T3 may be turned on by a control signal of a gate-on voltage (e.g., a high-level voltage) supplied to the ith control cline CLi during a sensing period (e.g., a set or predetermined sensing period) so that the jth sensing line SENj and the first transistor T1 can be electrically connected to each other.

The sensing period may be a period in which characteristic information of each of the pixels PXL disposed in the display area DA (e.g., a threshold voltage, etc. of the first transistor T1) may be determined.

The storage capacitor Cst may include a first electrode connected to the second node of the first transistor T1, and a second electrode connected to the first node N1. The storage capacitor Cst may be charged with a voltage corresponding to a data signal supplied to the first node N1, and maintain the charged voltage until a data signal of a subsequent frame is supplied.

The emission unit EMU may include a plurality of light emitting elements LD connected between a first power line PL1 to which the voltage of a first driving power supply VDD is applied and a second power line PL2 to which the voltage of a second driving power supply VSS is applied. For example, the emission unit EMU may include a first electrode EL1 (or a "first alignment electrode") connected to the first driving power supply VDD via the pixel circuit PXC and the first power line PL1, a second electrode EL2 (or a "second alignment electrode") connected to the second driving power supply VSS through the second power line PL2, and a plurality of light emitting elements LD coupled in series/parallel connection to each other in the same direction between the first and second electrodes EL1 and EL2.

Each of the light emitting elements LD included in the emission unit EMU may include a first end connected to the first driving power supply VDD through the first electrode EL1, and a second end connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PX.

As described above, the light emitting elements LD that are coupled in parallel to each other in the same direction (e.g., in a forward direction) between the first electrode EL1 and the second electrode EL2 to which voltages having different potentials are respectively supplied may form respective valid light sources. The valid light sources may be collected to form the emission unit EMU of the pixel PXL.

The light emitting elements LD of the emission unit EMU may emit light having a luminance corresponding to driving current supplied thereto through the pixel circuit PXC. For example, during each frame period, the pixel circuit PXC may supply driving current corresponding to a grayscale value of corresponding frame data to the emission unit EMU. The driving current supplied to the emission unit EMU may be divided into parts which flow into the respective light emitting elements LD. Hence, each of the light emitting elements LD may emit light having a luminance corresponding to current applied thereto, so that the emission unit EMU may emit light having a luminance corresponding to the driving current.

In some embodiments, the emission unit EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be coupled in parallel to each other between the first and second electrodes EL1 and EL2. Here, the reverse light emitting element LDr may be coupled between the first and second electrodes EL1 and EL2 in a direction opposite to that of the light emitting elements LD. Even when a driving voltage (e.g., a set or predetermined driving voltage) (e.g., a normal direction driving voltage) is applied between the first and second electrodes EL1 and EL2, the reverse light emitting element LDr remains deactivated. Hence, current substantially does not flow through the reverse light emitting element LDr.

Each emission unit EMU may include at least one serial set including a plurality of light emitting elements LD coupled in parallel to each other. In other words, as illustrated in FIG. 7, the emission unit EMU may have a serial/parallel mixed structure.

For example, the emission unit EMU may include first and second serial sets which are successively coupled between the first and second driving power supplies VDD and VSS. Each of the first and second serial sets SET1 and SET2 may include two electrodes EL1 and CTE1, CTE2 and EL2 that forms an electrode pair of the corresponding serial set, and a plurality of light emitting elements LD coupled in parallel to each other in the same direction between the two electrodes EL1 and CTE1, CTE2 and EL2.

The first serial set SET1 may include a first electrode EL1, a first intermediate electrode CTE1, and at least one first light emitting element LD1 coupled between the first electrode EL1 and the first intermediate electrode CTE1. Furthermore, the first serial set SET1 may include a reverse light emitting element LDr coupled between the first electrode EL1 and the first intermediate electrode CTE1 in a direction opposite to that of the first light emitting element LD1.

The second serial set SET2 may include a second intermediate electrode CTE2, a second electrode EL2, and at least one second light emitting element LD2 coupled between the second intermediate electrode CTE2 and the second electrode EL2. Furthermore, the second serial set SET2 may include a reverse light emitting element LDr coupled between the second intermediate electrode CTE2 and the second electrode EL2 in a direction opposite to that of the second light emitting element LD2.

The first intermediate electrode CTE1 of the first serial set SET1 and the second intermediate electrode CTE2 of the second serial set SET2 may be integrally provided and coupled to each other. In other words, the first intermediate electrode CTE1 and the second intermediate electrode CTE2 may form an intermediate electrode CTE that electrically couples the first serial set SET1 and the second serial set SET2 that are successively provided. In the case where the first intermediate electrode CTE1 and the second intermediate electrode CTE2 are integrally provided, the first intermediate electrode CTE1 and the second intermediate electrode CTE2 may be respective different areas of the intermediate electrode CTE.

In the foregoing embodiment, the first electrode EL1 of the first serial set SET1 may be an anode electrode of the emission unit EMU of each pixel PXL. The second electrode EL2 of the second serial set SET2 may be a cathode electrode of the emission unit EMU.

Although FIG. 7 illustrates an embodiment where all of the first to third transistors T1 to T3 are N-type transistors, the present disclosure is not limited thereto. For example, at least one of the first to third transistors T1 to T3 may be changed to a P-type transistor. Furthermore, although FIG. 7 illustrates an embodiment where the emission unit EMU is coupled between the pixel circuit PXC and the second driving power supply VSS, the emission unit EMU may be coupled between the first driving power supply VDD and the pixel circuit PXC.

The structure of the pixel circuit PXC may be changed in various ways. For example, the pixel circuit PXC may further include at least one transistor element such as a transistor element configured to initialize the first node N1, and/or a transistor element configured to control an emission time of the light emitting elements LD, or other circuit elements such as a boosting capacitor for boosting the voltage of the first node N1.

The structure of the pixel PXL which may be applied to the present disclosure is not limited to the embodiment illustrated in FIG. 7, and the pixel PXL may have various structures. For example, each pixel PXL may be configured in a passive light emitting display device, or the like. In such a case, the pixel circuit PXC may be omitted, and the opposite ends of the light emitting elements LD included in the emission unit EMU may be directly connected to the ith scan lines Si, the jth data linen Dj, the first power line PL1 to which the first driving power supply VDD is to be applied, the second power line PL2 to which the second driving power supply VSS is to be applied, and/or a control line (e.g., a set or predetermined control line).

Figure 8:
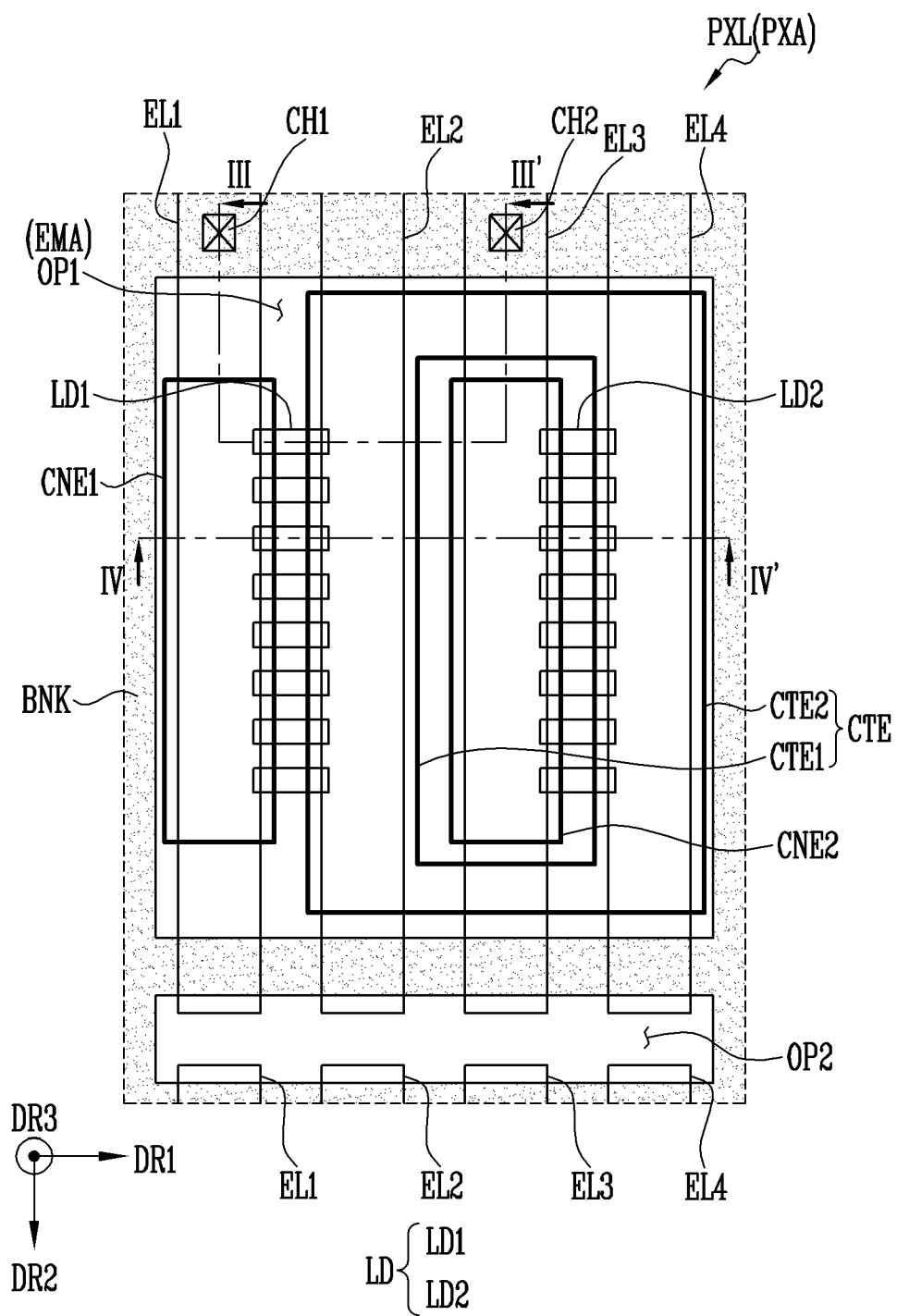
FIGS. 8 and 9 are plan diagrams schematically illustrating one of the pixels illustrated in FIGS. 5A and 5B.
Figure 9:
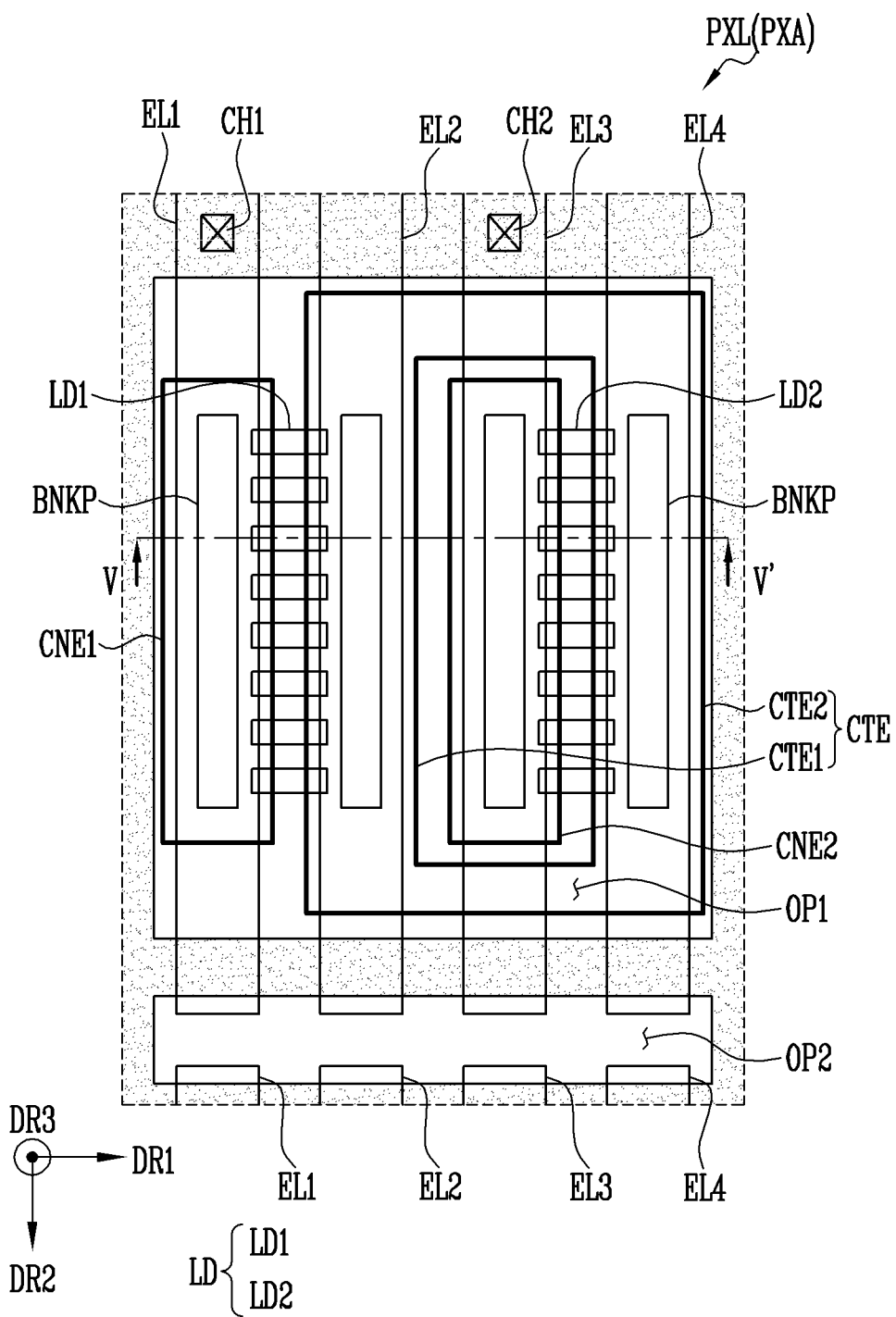
Figure 10:
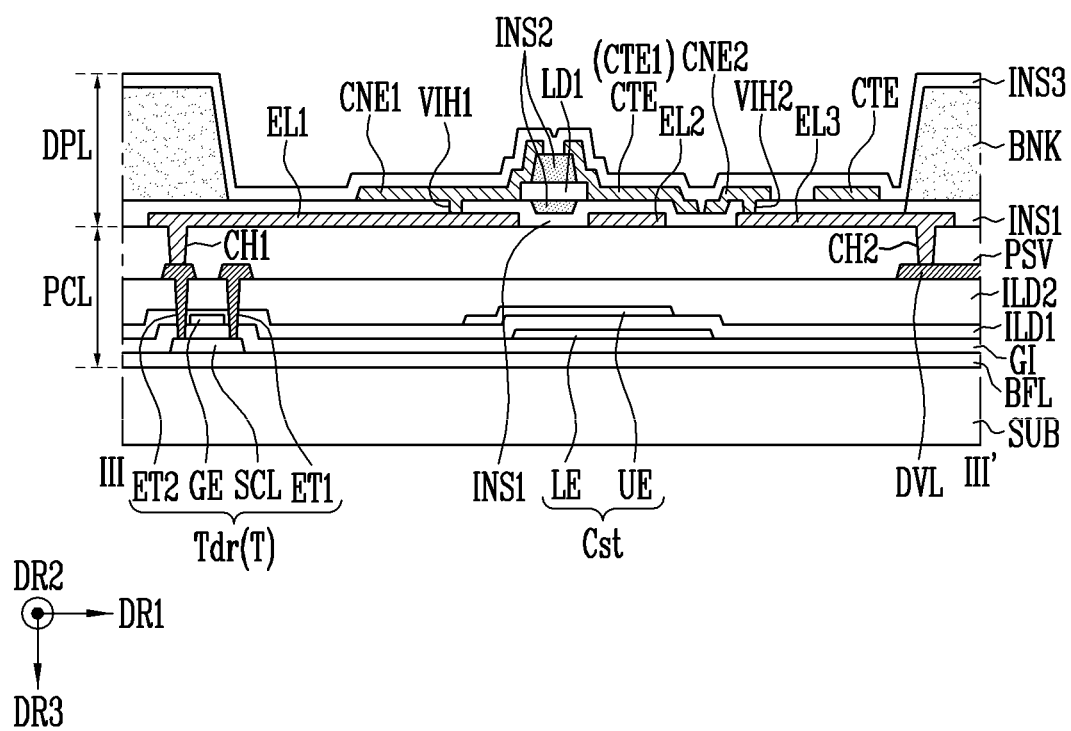
FIG. 10 is a schematic sectional diagram taken along the line III-III' of FIG. 8.
Figure 11:
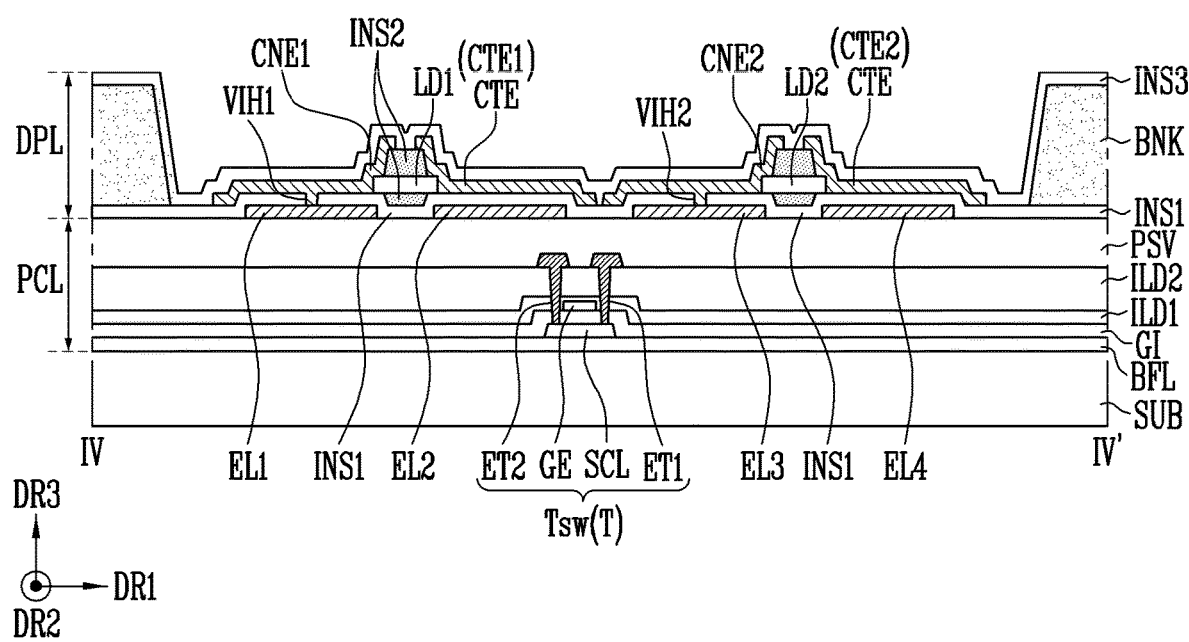
FIG. 11 is a schematic sectional diagram taken along the line IV-IV' of FIG. 8.
Figure 12:
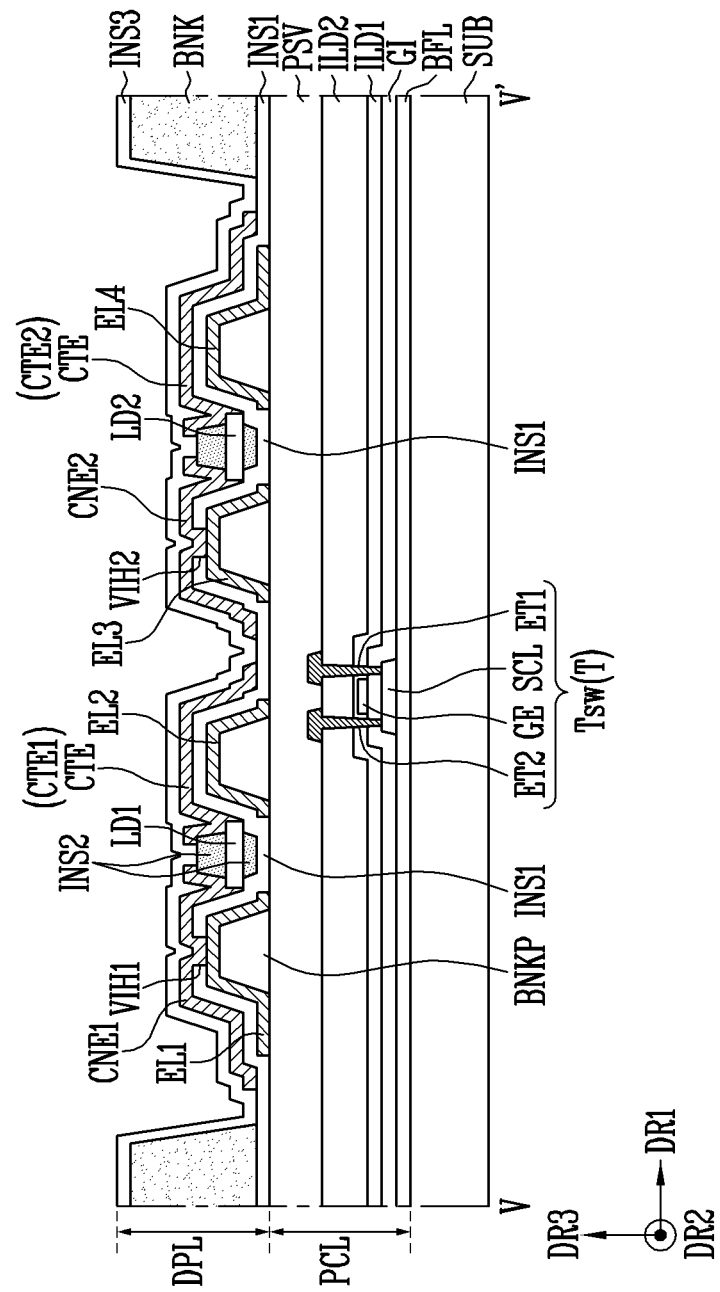
FIG. 12 is a schematic sectional diagram taken along the line V-V' of FIG. 9.
Figure 13:
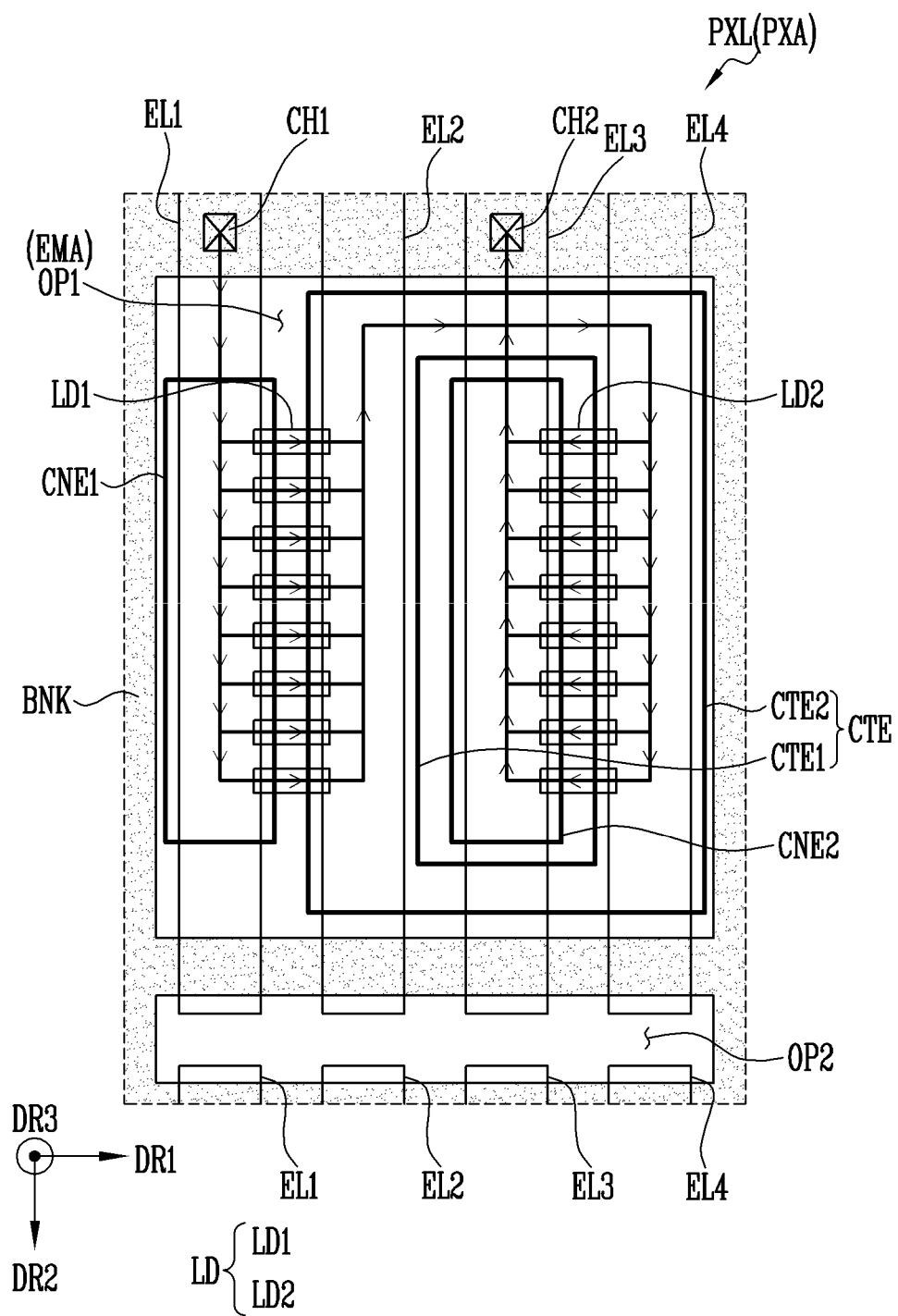
FIG. 13 is a plan diagram illustrating driving current flowing through a pixel in accordance with one or more embodiments of the present disclosure and, for example, illustrates the flow of driving current flowing through the pixel of FIG. 8.

FIGS. 8 and 9 are plan diagrams schematically illustrating one of the pixels illustrated in FIGS. 5A and 5B. FIG. 10 is a schematic sectional diagram taken along the line III-III' of FIG. 8. FIG. 11 is a schematic sectional diagram taken along the line IV-IV' of FIG. 8. FIG. 12 is a schematic sectional diagram taken along the line V-V' of FIG. 9. FIG. 13 is a plan diagram illustrating driving current flowing through a pixel in accordance with one or more embodiments of the present disclosure and, for example, illustrates the flow of driving current flowing through the pixel of FIG. 8.

In FIGS. 8 and 9, for the sake of explanation, illustration of the transistors T electrically connected to the light emitting elements LD and the signal lines connected to the transistors T are omitted.

Although FIGS. 8-13 simply illustrate a pixel PXL, e.g., illustrating that each electrode is formed of a single electrode and each insulating layer is formed of a single insulating layer, the present disclosure is not limited thereto.

In some embodiments of the present disclosure, the term "connection (or coupling)" between two components may embrace electrical connection and physical connection.

Furthermore, in some embodiments of the present disclosure, for the sake of explanation, a transverse direction (or a horizontal direction) in a plan view is indicated by a first direction DR1, a longitudinal direction (or a vertical direction) in a plan view is indicated by a second direction DR2, and a thickness direction of the substrate SUB in a sectional view is indicated by a third direction DR3. The first to third directions DR1, DR2, and DR3 may refer to the directions indicated by the first to third directions DR1, DR2, and DR3, respectively.

Referring to FIGS. 1-13, the display device DD in accordance with one or more embodiments of the present disclosure may include a plurality of pixels PXL provided on the substrate SUB.

The substrate SUB may include transparent insulating material to allow light transmission. The substrate SUB may be a rigid substrate or a flexible substrate.

For example, the rigid substrate SUB may be one of a glass substrate, a quartz substrate, a glass ceramic substrate, and a crystalline glass substrate.

The flexible substrate SUB may be either a film substrate or a plastic substrate which includes polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

Material applied to the substrate SUB may have resistance (e.g., thermal resistance) to high treatment temperatures during a process of fabricating the display device.

The substrate SUB may include a display area DA including a pixel area PXA in which each pixel PXL is disposed, and a non-display area NDA disposed around (or adjacent to) the display area DA (e.g., surrounding the display area along the edge or periphery of the display area DA).

In some embodiments, pixels PXL may be arranged in the display area DA in a matrix shape and/or a stripe shape along a plurality of pixel rows extending in a first direction DR1 and a plurality of pixel columns extending a second direction DR2 different from the first direction DR1, e.g., crossing the first direction DR1, but the present disclosure is not limited thereto. In some embodiments, the pixels PXL may be disposed in the display area DA of the substrate SUB in various arrangement manners.

The pixel area PXA in which each pixel PXL is provided may include an emission area from which light is emitted, and a peripheral area adjacent to the emission area (or enclosing the perimeter of the emission area). Here, the term "peripheral area" may include a non-emission area from which no light is emitted.

A line component electrically connected with the pixels PXL may be disposed on the substrate SUB. The line component may include a plurality of signal lines configured to transmit a signal or a voltage (e.g., a set or predetermined signal (or a predetermined voltage)) to each pixel PXL. The signal lines may include an ith scan line Si configured to transmit a scan signal to each pixel PXL, a jth data line Dj configured to transmit a data signal to each pixel PXL, and a driving voltage line DVL configured to transmit driving power to each pixel PXL. In some embodiments, the line component may further include an emission control line configured to transmit an emission control signal to each pixel PXL. In some embodiments, the line component may further include a sensing line and a control line which are connected to each pixel PXL.

Each pixel PXL may include a pixel circuit layer PCL provided on the substrate SUB and including a pixel circuit PXC, and a display element layer DPL including a plurality of light emitting elements LD. The light emitting elements LD may be disposed in the pixel area PXA of each pixel PXL.

For the convenience sake, the pixel circuit layer PCL will be first described, and then the display element layer DPL will be described.

The pixel circuit layer PCL may include a buffer layer BFL, a pixel circuit PXC, and a passivation layer PSV.

The buffer layer BFL may prevent impurities from diffusing into the transistors T included in the pixel circuit PXC. The buffer layer BFL may be an inorganic insulating layer formed of inorganic material. The buffer layer BFL may include at least one of silicon nitride SiNx, silicon oxide SiOx, silicon oxynitride SiOxNy, and aluminum oxide AlOx. Although the buffer layer BFL may be provided in a single-layer structure, the buffer layer BFL may be provided in a multi-layer structure having at least two or more layers. In the case where the buffer layer BFL has a multi-layer structure, the respective layers may be formed of the same material or different materials. The buffer layer BFL may be omitted depending on the material of the substrate SUB or processing conditions.

The pixel circuit PXC may include one or more transistors T and a storage capacitor Cst. The transistors T may include a driving transistor Tdr (e.g., T1 of FIG. 7) configured to control driving current of the light emitting elements LD, and a switching transistor Tsw (e.g., T2 of FIG. 7) connected to the driving transistor Tdr. However, the present disclosure is not limited thereto. The pixel circuit PXC may further include circuit elements configured to perform other functions, as well as including the driving transistor Tdr and the switching transistor Tsw. In the following embodiments, the driving transistor Tdr and the switching transistor Tsw may be embraced in the term "transistor T" or "transistors T". The driving transistor Tdr may have the same configuration as that of the first transistor T1 described with reference to FIG. 7. The switching transistor Tsw may have the same configuration as that of the second transistor T2 described with reference to FIG. 7.

Each of the driving transistor Tdr and the switching transistor Tsw may include a semiconductor pattern SCL, a gate electrode GE, a first terminal ET1, and a second terminal ET2. The first terminal ET1 may be either a source electrode or a drain electrode, and the second terminal ET2 may be the other electrode of the transistor.

The semiconductor pattern SCL may be provided and/or formed on the buffer layer BFL. The semiconductor pattern SCL may include a first contact area which comes into contact with the first terminal ET1, and a second contact area which comes into contact with the second terminal ET2. An area between the first contact area and the second contact area may be a channel area. The channel area may overlap with the gate electrode GE of the corresponding transistor T. The semiconductor pattern SCL may be a semiconductor pattern formed of polysilicon, amorphous silicon, an oxide semiconductor, etc. For example, the channel area may be a semiconductor pattern undoped with impurities and an intrinsic semiconductor. Each of the first contact area and the second area may be a semiconductor pattern doped with impurities. A gate insulating layer GI may be formed on the BFL to cover the buffer layer BFL and the semiconductor pattern SCL.

The gate electrode GE may be provided and/or formed on the gate insulating layer GI to correspond to the channel area of the semiconductor pattern SCL. The gate electrode GE may be provided on the gate insulating layer GI and overlap with the channel area of the semiconductor pattern SCL. The gate electrode GE may have a single-layer structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance.

The gate insulating layer GI may be an inorganic insulating layer formed of inorganic material. For example, the gate insulating layer GI may include at least one of metal oxides such as silicon nitride SiNx, silicon oxide SiOx, silicon oxynitride SiOxNy, and aluminum oxide AlOx. However, the material of the gate insulating layer GI is not limited to that of the foregoing embodiments. In some embodiments, the gate insulating layer GI may be formed of an organic insulating layer including organic material. Although the gate insulating layer GI may be provided in a single-layer structure, the gate insulating layer GI may be provided in a multi-layer structure having at least two or more layers.

The first terminal ET1 and the second terminal ET2 may be provided and/or formed on a second interlayer insulating layer ILD2 and come into contact with the first contact area and the second contact area of the semiconductor pattern SCL through contact holes successively passing through the gate insulating layer GI, and the first and second interlayer insulating layers ILD1 and ILD2. For example, the first terminal ET1 may come into contact with the first contact area of the semiconductor pattern SCL, and the second terminal ET2 may come into contact with the second contact area of the semiconductor pattern SCL. Each of the first and second terminals ET1 and ET2 may include the same material as that of the gate electrode GE, or include one or more materials selected from among materials exemplified as the material for forming the gate electrode GE.

The first interlayer insulating layer ILD1 may be disposed on the gate insulating layer GI and the gate electrode GE of the transistor T and include the same material as that of the gate insulating layer GI, or may include one or more materials selected from among materials exemplified as the material for forming the gate insulating layer GI.

A second interlayer insulating layer ILD2 may be provided and/or formed on the first interlayer insulating layer ILD1. The second interlayer insulating layer ILD2 may be an inorganic insulating layer including inorganic material or an organic insulating layer including organic material. In some embodiments, the second interlayer insulating layer ILD2 may include the same material as that of the first interlayer insulating layer ILD1, but the present disclosure is not limited thereto. Although the second interlayer insulating layer ILD2 may be provided in a single-layer structure, the second interlayer insulating layer ILD2 may be provided in a multi-layer structure having at least two or more layers.

Although in the foregoing embodiment the first and second terminals ET1 and ET2 of each of the driving transistor Tdr and the switching transistor Tsw each have been described as being a separate electrode electrically connected with the semiconductor pattern SCL through the contact hole that successively passes through the gate insulating layer GI and the first and second interlayer insulating layers ILD1 and ILD2, the present disclosure is not limited thereto. In some embodiments, the first terminal ET1 of each of the driving transistor Tdr and the switching transistor Tsw may be a first contact area adjacent to the channel area of the corresponding semiconductor pattern SCL. The second terminal ET2 of each of the driving transistor Tdr and the switching transistor Tsw may be a second contact area adjacent to the channel area of the corresponding semiconductor pattern SCL. In this case, the second terminal ET2 of the driving transistor Tdr may be electrically connected to the light emitting elements LD of the pixel PXL through a separate connector such as a bridge electrode.

In some embodiments of the present disclosure, the transistors T included in the pixel circuit PXC may be formed of a low temperature polycrystalline silicon thin film transistor (LTPS TFT), but the present disclosure is not limited thereto. In some embodiments, each of the transistors T included in the pixel circuit PXC may be formed of an oxide semiconductor thin-film transistor. Furthermore, although in the foregoing embodiment there has been illustrated the case where each of the transistors T is a thin-film transistor having a top gate structure, the present disclosure is not limited thereto. The structure of the transistors T may be changed in various ways.

The storage capacitor Cst may include a lower electrode LE provided on the gate insulating layer GI, and an upper electrode UE which is provided on the first interlayer insulating layer ILD1 and overlaps with the lower electrode LE.

The lower electrode LE may be provided at the same layer as that of the gate electrode GE and the ith scan line Si of each of the driving transistor Tdr and the switching transistor Tsw and include the same material as that of the gate electrode GE and the ith scan line Si. The lower electrode LE may be integrally provided with the driving transistor Tdr and the gate electrode GE. In this case, the lower electrode LE may be regarded as being one area of the gate electrode GE of the driving transistor Tdr. In some embodiments, the lower electrode LE may be provided as a component separate from the gate electrode GE of the driving transistor Tdr. In this case, the lower electrode LE may be electrically connected with the gate electrode GE of the driving transistor Tdr through a separate connector.

The upper electrode UE may overlap with the lower electrode LE and cover the lower electrode LE in the third direction DR3. The capacity of the storage capacity Cst may be increased by increasing an overlapping area between the upper electrode UE and the lower electrode LE. The upper electrode UE may be electrically connected with the first power line PL1. The storage capacitor Cst may be covered by the second interlayer insulating layer ILD2.

The pixel circuit layer PCL may include a driving voltage line DVL provided and/or formed on the second interlayer insulating layer ILD2. The driving voltage line DVL may have the same configuration as that of the second power line PL2 described with reference to FIG. 7. Hence, the voltage of the second power supply VSS may be applied to the driving voltage line DVL. The pixel circuit layer PCL may further include a first power line PL1 connected to the first driving power supply VDD. In some embodiments, the first power line PL1 may be at the same layer as that of the driving voltage line DVL or provided on a layer different from that of the driving voltage line DVL. Although in the foregoing embodiment the driving voltage line DVL has been described as being provided at the same layer as that of the first and second terminals ET1 and ET2 of the transistors T, the present disclosure is not limited thereto. In some embodiments, the driving voltage line DVL may be provided at the same layer as that of any one conductive layer of the conductive layers provided on the pixel circuit layer PCL. In other words, the location of the driving voltage line DVL in the pixel circuit PCL may be changed in various ways.

Each of the first power line PL1 and the driving voltage line DVL may include conductive material. For example, each of the first power line PL1 and the driving voltage line DVL may have a single-layer structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance. For instance, each of the first power line PL1 and the driving voltage line DVL may have a double-layer structure formed by stacking layers in a sequence of titanium (Ti) and copper (Cu).

The first power line PL1 may be electrically connected with a component of the display element layer DPL, e.g., the first electrode EL1 of the display element layer DPL. The driving voltage line DVL may be electrically connected with another component of the display element layer DPL, e.g., the third electrode EL3 of the display element layer DPL.

The passivation layer PSV may be provided and/or formed on the transistors T and the driving voltage line DVL.

The passivation layer PSV may be provided in the form of an organic insulating layer, an inorganic insulating layer, or a structure including an organic insulating layer disposed on an inorganic insulating layer. The inorganic insulating layer may include, for example, at least one of metal oxides such as silicon oxide SiOx, silicon nitride SiNx, silicon oxynitride SiOxNy, and aluminum oxide AlOx. The organic insulating layer may include, for example, at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

The passivation layer PSV may include a first contact hole CH1 through which the second terminal ET2 of the driving transistor Tdr is exposed, and a second contact hole CH2 through which the driving voltage line DVL is exposed.

The display element layer DPL may be provided on the passivation layer PSV.

The display element layer DPL may include a bank BNK, first to fourth electrodes EL1 to EL4, light emitting elements LD, first and second contact electrodes CNE1 and CNE2, an intermediate electrode CTE, first to third insulating layers INS1 to INS3.

The bank BNK may be disposed in a peripheral area enclosing at least one side of each emission area EMA. The bank BNK may be a structure for defining (or partitioning) the pixel area PXA or the emission area EMA of each of the corresponding pixel PXL and pixels PXL adjacent thereto and, for example, may be a pixel defining layer. The bank BNK may include at least one light shielding material and/or reflective material, thus preventing a light leakage defect in which light (or rays) leaks between the corresponding pixel PXL and the pixels PXL adjacent thereto.

The bank BNK may include a first opening OP1 and a second opening OP2 through which components disposed therebelow are exposed. The emission area EMA of each of the pixels PXL may be defined by the first opening OP1. The second opening OP2 may be disposed in the pixel area PXA of each of the pixels PXL at a position spaced from the first opening OP1, and may be disposed adjacent to one side of the pixel area PXA (e.g., an upper side or a lower side of the pixel area PXA).

The first electrode EL1, the second electrode EL2, the third electrode EL3, and the fourth electrode EL4 may be successively arranged along the first direction DR1. The first electrode EL1, the second electrode EL2, the third electrode EL3, and the fourth electrode EL4 may extend in the second direction DR2 different from the first direction DR1. For example the fourth electrode EL4 may extend in the second direction DR2 crossing the first direction DR1. Respective ends of the first to fourth electrodes EL1 to EL4 may be disposed in the second opening OP2. The first to fourth electrodes EL1 to EL4 may be separated from other electrodes (e.g., electrodes provided in pixels PXL adjacent thereto in the second direction DR2) in the second opening OP2 after the light emitting elements LD are supplied and aligned in the pixel area PXA during a process of fabricating the display device DD. The second opening OP2 of the bank BNK may be provided for a separation process for the first electrode EL1, the second electrode EL2, the third electrode EL3, and the fourth electrode EL4 to be separated from the electrodes of the adjacent pixels in the second direction DR2.

In an emission area EMA of each pixel PXL, each of the first to fourth electrodes EL1 to EL4 may be spaced from an electrode adjacent thereto in the first direction DR1. For example, the first electrode EL1 may be disposed at a position spaced from the second electrode EL2. The second electrode EL2 may be disposed at a position spaced from the third electrode EL3. The third electrode EL3 may be disposed at a position spaced from the fourth electrode EL4. Although the distance between the first electrode EL1 and the second electrode EL2, the distance between the second electrode EL2 and the third electrode EL3, and the distance between the third electrode EL3 and the fourth electrode EL4 may be the same as each other, the present disclosure is not limited thereto. In some embodiments, the distance between the first electrode EL1 and the second electrode EL2, the distance between the second electrode EL2 and the third electrode EL3, and the distance between the third electrode EL3 and the fourth electrode EL4 may be different from each other.

The first to fourth electrodes EL1 to EL4 may be formed of material having a reflectivity (e.g., a set or predetermined reflectivity) to enable light emitted from each of the light emitting elements LD to travel in an image display direction (e.g., in the frontal direction) of the display device. For example, the first to fourth electrode EL1 to EL4 may be formed of conductive material having a reflectivity (e.g., a set or predetermined reflectivity). The conductive material may include opaque metal that is suitable for reflecting, in the image display direction of the display device, light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. In some embodiments, the first to fourth electrode EL1 to EL4 may be formed of transparent conductive material. The transparent conductive material may include transparent conductive oxides such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly(3,4-ethylenedioxythiophene)). In the case where the first to fourth electrodes EL1 to EL4 include transparent conductive material, a separate conductive layer formed of opaque metal for reflecting light emitted from the light emitting elements LD in the image display direction of the display device may be added. However, the material of the first to fourth electrodes EL1 to EL4 is not limited to the foregoing materials.

Although each of the first to fourth electrodes EL1 to EL4 may be provided and/or formed in a single-layer structure, the present disclosure is not limited thereto. In some embodiments, each of the first to fourth electrodes EL1 to EL4 may be provided and/or formed in a multi-layer structure formed by stacking at least two materials from among metals, alloys, conductive oxides, and conductive polymers. Each of the first to fourth electrodes EL1 to EL4 may be formed of a multi-layer structure including at least two layers to reduce or minimize distortion resulting from a signal delay when signals (or voltages) are transmitted to opposite ends of each of the light emitting elements LD. For example, each of the first to fourth electrodes EL1 to EL4 may be formed of a multi-layer structure formed by stacking layers in a sequence of indium tin oxide (ITO)/silver (Ag)/indium tin oxide (ITO).

The first electrode EL1 may be electrically connected with the driving transistor Tdr of the pixel circuit layer PCL through the first contact hole CH1 of the passivation layer PSV. The third electrode EL3 may be electrically connected with the driving voltage line DVL of the pixel circuit layer PCL through the second contact hole CH2 of the passivation layer PSV. The first electrode EL1 may have the same configuration as that of the first electrode EL1 described with reference to FIG. 7. The third electrode EL3 may have the same configuration as that of the second electrode EL2 described with reference to FIG. 7.

In some embodiments, a support component may be disposed between each of the first to fourth electrodes EL1 to EL4 and the passivation layer PSV. For example, as illustrated in FIGS. 9-12, a bank pattern BNKP may be disposed between each of the first to fourth electrodes EL1 to EL4 and the passivation layer PSV.

The bank pattern BNKP may be disposed in the emission area EMA of each pixel PXL. The bank pattern BNKP may be a support component which supports the first to fourth electrodes EL1 to EL4 to change a surface profile (or a surface shape) of each of the first to fourth electrodes EL1 to EL4 so that light emitted from the light emitting elements LD is guided in the image display direction of the display device.

The bank pattern BNKP may be provided in the emission area EMA of the corresponding pixel PXL between the passivation layer PSV and the first to fourth electrodes EL1 to EL4.

The bank pattern BNKP may be an inorganic insulating layer including inorganic material or an organic insulating layer including organic material. In some embodiments, the bank pattern BNKP may include an organic insulating layer having a single-layer structure and/or an inorganic insulating layer having a single-layer structure, but the present disclosure is not limited thereto. In some embodiments, the bank pattern BNKP may be provided in a multi-layer structure formed by stacking at least one organic insulating layer and at least one inorganic insulating layer. However, the material of the bank pattern BNKP is not limited to the foregoing embodiment. In some embodiments, the bank pattern BNKP may include conductive material.

The bank pattern BNKP may have a trapezoidal cross-section which is reduced in width from one surface (e.g., an upper surface) of the passivation layer PSV upward in the third direction DR3, but the present disclosure is not limited thereto. In some embodiments, the bank pattern BNKP may include a curved surface having a cross-sectional shape such as a semi-elliptical shape or a semi-circular shape (or a hemispherical shape) which is reduced in width from one surface of the passivation layer PSV upward in the third direction DR3. In a sectional view, the shape of the bank pattern BNKP is not limited to the foregoing examples, and may be changed in various ways within a range in which the efficiency of light emitted from each of the light emitting elements LD can be enhanced. In a plan view, the bank pattern BNKP may have a bar shape extending in the second direction DR2, but the present disclosure is not limited thereto.

Each of the first to fourth electrodes EL1 to EL4 may be provided and/or formed on the bank pattern BNKP. Hence, each of the first to fourth electrodes EL1 to EL4 may have a surface profile corresponding to the shape of the bank pattern BNKP disposed therebelow, so that light emitted from the light emitting elements LD may be reflected by each of the first to fourth electrodes EL1 to EL4 and more efficiently travel in the image display direction of the display device. The bank pattern BNKP and each of the first to fourth electrodes EL1 to EL4 may function as a reflective component configured to guide light emitted from the light emitting elements LD in a desired direction and thus enhance the optical efficiency. In the case where each pixel PXL does not include the bank pattern BNKP, the first to fourth electrodes EL1 to EL4 may be provided and/or formed on one surface (e.g., the upper surface) of the passivation layer PSV.

Each of the first to fourth electrodes EL1 to EL4 may function as an alignment electrode (or an alignment line) configured to receive, before the light emitting elements LD are aligned in the pixel area PXA of each pixel PXL, an alignment signal (e.g., a set or predetermined alignment signal) (or an alignment voltage) from the driving voltage supply line SGL disposed in the non-display area NDA of the substrate SUB and then align the light emitting elements LD.

For example, the first electrode EL1 may function as a first alignment electrode (or a first alignment line) which is electrically connected with a first driving voltage supply line SGL1 disposed in the non-display area NDA of the substrate SUB and is configured to receive a first alignment signal (or a first alignment voltage) from the first driving voltage supply line SGL1. For example, the second electrode EL2 may function as a second alignment electrode (or a second alignment line) which is electrically connected with a second driving voltage supply line SGL2 disposed in the non-display area NDA and is configured to receive a second alignment signal (or a second alignment voltage) from the second driving voltage supply line SGL2.

For example, the third electrode EL3 may function as a third alignment electrode (or a third alignment line) which is electrically connected with the second driving voltage supply line SGL2 and is configured to receive a second alignment signal (or a second alignment voltage) from the second driving voltage supply line SGL2. For example, the fourth electrode EL4 may function as a fourth alignment electrode (or a fourth alignment line) which is electrically connected with a third driving voltage supply line SGL3 disposed in the non-display area NDA and is configured to receive a third alignment signal (or a third alignment voltage) from the third driving voltage supply line SGL3. The same second alignment signal (or the same second alignment voltage) may be applied to the second and third electrodes EL2 and EL3.

The above-mentioned first to fourth alignment signals (or alignment voltages) may be signals having a voltage difference and/or a phase difference enabling the light emitting elements LD to be aligned between the first to fourth electrodes EL1 to EL4 (e.g., between the first and second electrodes EL1 and EL2 and between third and fourth electrodes EL3 and EL4). Although at least one alignment signal (or alignment voltage) of the first to fourth alignment signals (or alignment voltages) may be an alternating current signal (or voltage), the present disclosure is not limited thereto.

In the emission area EMA of each pixel PXL, the first electrode EL1 and the second electrode EL2, along with a plurality of light emitting elements LD (e.g., a plurality of first light emitting elements LD1) coupled in parallel to each other therebetween, may form a first serial set SET1. The third electrode EL3 and the fourth electrode EL4, along with a plurality of light emitting elements LD (e.g., a plurality of second light emitting elements LD2) coupled in parallel to each other therebetween, may form a second serial set SET2.

In some embodiments of the present disclosure, the first and second serial sets SET1 and SET2 are disposed in the pixel area PXA or the emission area EMA of each pixel PXL. The first and second serial sets SET1 and SET2 may form an emission unit EMU of the corresponding pixel PXL.

The first electrode EL1 included in the first serial set SET1 may be an anode electrode of the emission unit EMU of each pixel PXL. The third electrode EL3 included in the second serial set SET2 may be a cathode electrode of the emission unit EMU.

After the light emitting elements LD are aligned in the pixel area PXA of each pixel PXL, so as to independently (or individually) drive the corresponding pixel PXL from pixels PXL adjacent therefrom, a portion of each of the first to fourth electrodes EL1 to EL4 disposed between the pixels PXL adjacent to each other in one direction, e.g., the second direction DR2, may be removed, and an end thereof may be disposed in the second opening OP2 of the bank BNK. Furthermore, after the light emitting elements LD are aligned in the pixel area PXA, the first to fourth electrodes EL1 to EL4 may be electrically separated from the first to third driving voltage supply lines SGL1 to SGL3. After the light emitting elements LD are aligned, the first to third driving voltage supply lines SGL1 to SGL3 may be connected to the driving power supply so that the voltage of the driving power supply can be transmitted to each of the pixels PXL.

Each of the light emitting elements LD may be formed of a light emitting diode which is made of material having an inorganic crystal structure and has a subminiature size, e.g., ranging from a nano-scale to a micro-scale. Each of the light emitting elements LD may be a subminiature light emitting diode fabricated by an etching method or a growth method.

Although at least two to several tens of light emitting elements LD may be aligned and/or provided in the emission area EMA of each pixel PXL, the number of light emitting elements LD is not limited thereto. In some embodiments, the number of light emitting elements LD aligned and/or provided in the pixel area PXA may be changed in various ways.

Each of the light emitting elements LD may emit any one light of color light and/or white light. Each of the light emitting elements LD may be aligned on the first insulating layer INS1 between two adjacent electrodes from among the first to fourth electrodes EL1 to EL4 such that the extension direction thereof (or the longitudinal direction L thereof) is parallel to the first direction DR1 in a plan and sectional view. The light emitting elements LD may be diffused in a solution and supplied into the pixel area PXA of each pixel PXL.

The light emitting elements LD may be supplied into the pixel area PXA of each pixel PXL by an inkjet printing method, a slit coating method, or other various methods. For example, the light emitting elements LD may be mixed with a volatile solvent and then supplied to the pixel area PXA by an inkjet printing method or a slit coating method. If corresponding alignment signals are respectively applied to the first to fourth electrodes EL1 to EL4 provided in the pixel area PXA, an electric field may be formed between two adjacent electrodes from among the first to fourth electrodes EL1 to EL4. Hence, light emitting elements LD may be aligned between two adjacent electrodes of the first to fourth electrodes EL1 to EL4. As described above, because the same alignment signal (or the same alignment voltage) is applied to each of the second and third electrodes EL2 and EL3, the light emitting elements LD may not be aligned between the second electrode LE2 and the third electrode EL3. However, the present disclosure is not limited to this. In some embodiments, when an alignment signal is applied to each of the second and third electrodes EL2 and EL3, a potential difference may occur between alignment signals applied to the second electrode EL2 and the third electrode EL3 due to line resistance of the two electrodes, an effect resulting from an electric field induced between adjacent electrodes, etc. In such a case, light emitting elements LD may also be aligned between the second and third electrodes EL2 and EL3.

After the alignment of the light emitting elements LD, the solvent may be removed by volatilization or other methods. As a result, the light emitting elements LD may be eventually aligned and/or provided in the pixel area PXA of each pixel PXL.

Although FIGS. 8 and 9 illustrate that the light emitting elements LD, the longitudinal direction (L) of which is parallel to the first direction DR1 are aligned between two adjacent electrodes of the first to fourth electrodes EL1 to EL4, the present disclosure is not limited thereto. In some embodiments, some of the light emitting elements LD may be aligned between two adjacent electrodes such that the longitudinal direction (L) thereof is parallel to the second direction DR2 and/or a direction inclined to the second direction DR2. Furthermore, in some embodiments, at least one reverse light emitting element LDr may be reversely connected between two adjacent electrodes.

In some embodiments of the present disclosure, the light emitting elements LD may include a plurality of first light emitting elements LD1 and a plurality of second light emitting elements LD2.

The first light emitting elements LD1 may be disposed between the first electrode EL1 and the second electrode EL2. The second light emitting elements LD2 may be disposed between the third electrode EL3 and the fourth electrode EL4.

The first light emitting elements LD1 may be aligned in the same direction between the first electrode EL1 and the second electrode EL2. For example, the first end of each of the first light emitting elements LD1 may be connected to the first electrode EL1, and the second end thereof may be connected to the second electrode EL2. The first electrode EL1 and the second electrode EL2, along with the first light emitting elements LD1 coupled in parallel to each other in the same direction therebetween, may form the first serial set SET1.

The second light emitting elements LD2 may be aligned in the same direction between the third electrode EL3 and the fourth electrode EL4. For example, the second end of each of the second light emitting elements LD2 may be connected to the third electrode EL3, and the first end thereof may be connected to the fourth electrode EL4. The third electrode EL3 and the fourth electrode EL4, along with the second light emitting elements LD2 coupled in the same direction therebetween, may form the second serial set SET2.

The first and second light emitting elements LD1 and LD2 may be provided and/or formed on the first insulating layer INS1.

The first insulating layer INS1 may be formed of an inorganic insulating layer including inorganic material, or an organic insulating layer including organic material. In some embodiments of the present disclosure, the first insulating layer INS1 may be formed of an inorganic insulating layer that is suitable for protecting the light emitting elements LD from the pixel circuit layer PCL of each pixel PXL. For example, the first insulating layer INS1 may include at least one of metal oxides such as silicon nitride SiNx, silicon oxide SiOx, silicon oxynitride SiOxNy, and aluminum oxide AlOx, but the present disclosure is not limited thereto. In some embodiments, the first insulating layer INS1 may be formed of an organic insulating layer that is suitable for planarization of support surfaces of the light emitting elements LD.

The first insulating layer INS1 may include a first via hole VIH1 which exposes one area of the first electrode EL1, and a second via hole VIH2 which exposes one area of the third electrode EL3. The first insulating layer INS1 may cover the other areas except the one area of the first electrode EL1 and the one area of the third electrode EL3.

The second insulating layer INS2 may be provided and/or formed on the light emitting elements LD. The second insulating layer INS2 may be provided and/or formed on the light emitting elements LD to partially cover the outer peripheral surface (e.g., the outer circumferential surface) (or the surface) of each of the light emitting elements LD such that the opposite ends of the light emitting element LD are exposed to the outside.

The second insulating layer INS2 may be formed of a single layer or multiple layers, and include an inorganic insulating layer including at least one inorganic material or an organic insulating layer including at least one organic material. The second insulating layer INS2 may more reliably fix each of the light emitting elements LD. The second insulating layer INS2 may include an inorganic insulating layer that is suitable for protecting the active layer 12 of each of the light emitting elements LD from external oxygen, water, etc. However, the present disclosure is not limited to this. The second insulating layer INS2 may be formed of an organic insulating layer including organic material, depending on design conditions, etc. of the display device to which the light emitting elements LD are applied as light sources.

In some embodiments of the present disclosure, after the arrangement of the light emitting elements LD in the pixel area PXA of each of the pixels PXL have been completed, the second insulating layer INS2 is formed on the light emitting elements LD so that the light emitting elements LD may be prevented from being removed from the aligned position. In the case where a gap (or space) is present between the first insulating layer INS1 and the light emitting elements LD before the formation of the second insulating layer INS2, the gap may be filled with the second insulating layer INS2 during a process of forming the second insulating layer INS2. Hence, the second insulating layer INS2 may be formed of an organic insulating layer that is suitable for filling the gap between the first insulating layer INS1 and the light emitting elements LD with the second insulating layer INS2.

The first and second contact electrodes CEN1 and CNE2 and the intermediate electrode CTE may be provided and/or formed on the first to fourth electrodes EL1 to EL4.

The first and second contact electrodes CEN1 and CNE2 and the intermediate electrode CTE may be components configured to more reliably electrically connect the first to fourth electrodes EL1 to EL4 and the light emitting elements LD.

The first contact electrode CNE1 may be provided and/or formed on the first electrode EL1. The first contact electrode CNE1 may be connected with the first electrode EL1 in such a way that the first contact electrode CNE1 comes into direct contact with the first electrode EL1 through the first via hole VIH1. In some embodiments, in the case where a capping layer is disposed on the first electrode EL1, the first contact electrode CNE1 may be disposed on the capping layer and may be connected with the first electrode EL1 through the capping layer. The capping layer may protect the first electrode EL1 from a defect or the like, which may occur during a process of fabricating the display device, and increase adhesive force between the first electrode EL1 and the pixel circuit layer PCL disposed therebelow. The capping layer may include transparent conductive material such as indium zinc oxide (IZO).

Furthermore, the first contact electrode CNE1 may be provided and/or formed on the respective first ends of the first light emitting elements LD1 and connected with the respective first ends of the first light emitting elements LD1. Therefore, the first electrode EL1 and the respective first ends of the first light emitting elements LD1 may be electrically connected with each other through the first contact electrode CNE1.

The second contact electrode CNE2 may be provided and/or formed on the third electrode EL3. The second contact electrode CNE2 may be connected with the third electrode EL3 in such a way that the second contact electrode CNE2 comes into direct contact with the third electrode EL3 through the second via hole VIH2. In some embodiments, in the case where a capping layer is disposed on the third electrode EL3, the second contact electrode CNE2 may be disposed on the capping layer and may be connected with the third electrode EL3 through the capping layer.

Furthermore, the second contact electrode CNE2 may be provided and/or formed on the respective second ends of the second light emitting elements LD2 and connected with the respective second ends of the second light emitting elements LD2. Therefore, the third electrode EL3 and the respective second ends of the second light emitting elements LD2 may be electrically connected with each other through the second contact electrode CNE2.

The first and second contact electrodes CNE1 and CNE2 may be formed of various transparent conductive materials to allow light emitted from each of the light emitting elements LD and reflected by the first and third electrodes EL1 and EL3 to travel in the image display direction of the display device without loss. For example, the first and second contact electrodes CNE1 and CNE2 may include at least one of various transparent conductive materials including indium tin oxide (ITO), indium zinc oxide (IZO), zinc oxide (ZnO), indium gallium zinc oxide (IGZO), and indium tin zinc oxide (ITZO), and may be substantially transparent or translucent to satisfy a transmittancy (e.g., a set or predetermined transmittancy) (or transmittance). The material of the first and second contact electrodes CNE1 and CNE2 is not limited to the above-mentioned materials. In some embodiments, the first and second contact electrodes CNE1 and CNE2 may also be formed of various opaque conductive materials. The first and second contact electrodes CNE1 and CNE2 each may be formed of a single layer or multiple layers.

In a plan view, each of the first and second contact electrodes CNE1 and CNE2 may have a bar shape extending in the second direction DR2, but the present disclosure is not limited thereto. In some embodiments, the shape of each of the first and second contact electrodes CNE1 and CNE2 may be changed in various ways with in a range in which the first and second contact electrodes CNE1 and CNE2 can be reliably electrically connected with each of the light emitting elements LD. Furthermore, the shape of each of the first and second contact electrodes CNE1 and CNE2 may be changed in various ways, taking into account connection relationship with electrodes disposed therebelow.

The intermediate electrode CTE may include a first intermediate electrode CTE1 and a second intermediate electrode CTE2 which extend in the second direction DR2.

The first intermediate electrode CTE1 may be provided on the second electrode EL2 and overlap with the second electrode EL2, in a plan view. The first intermediate electrode CTE1 may be disposed on the first insulating layer INS1 on the second electrode EL2 and electrically insulated from the second electrode EL2. The first intermediate electrode CTE1 may be disposed on the respective second ends of the first light emitting elements LD1 in the emission area EMA of each pixel PXL and may be electrically and/or physically connected with the first light emitting elements LD1.

The second intermediate electrode CTE2 may be provided on the fourth electrode EL4 and overlap with the fourth electrode EL4, in a plan view. The second intermediate electrode CTE2 may be disposed on the first insulating layer INS1 on the fourth electrode EL4 and electrically insulated from the fourth electrode EL4. The second intermediate electrode CTE2 may be disposed on the respective first ends of the second light emitting elements LD2 in the emission area EMA of each pixel PXL and may be electrically and/or physically connected with the second light emitting elements LD2.

The first intermediate electrode CTE1 and the second intermediate electrode CTE2 may be integrally provided and connected with each other. The first intermediate electrode CTE1 and the second intermediate electrode CTE2 may be respectively different areas of the intermediate electrode CTE. The first intermediate electrode CTE1 may have the same configuration as that of the first intermediate electrode CTE1 described with reference to FIG. 7. The second intermediate electrode CTE2 may have the same configuration as that of the second intermediate electrode CTE2 described with reference to FIG. 7. The intermediate electrode CTE may function as a bridge electrode (or a connection electrode) for electrically connecting the second end of each of the first light emitting elements LD1 with the first end of each of the second light emitting elements LD2. In other words, the intermediate electrode CTE may be a bridge electrode (or a connection electrode) for coupling the first serial set SET1 with the second serial set SET2.

In a plan view, the intermediate electrode CTE including the first intermediate electrode CTE1 and the second intermediate electrode CTE2 may be spaced from the second contact electrode CNE2 and have a closed loop shape enclosing the perimeter (or the edges) of the second contact electrode CNE2, but the present disclosure is not limited thereto. In some embodiments, the intermediate electrode CTE may be changed in various shapes, so long as it can reliably couple the first serial set SET1 and the second serial set SET2 that are successive to each other.

The first serial set SET1, the second serial set SET2, and the intermediate electrode CTE may be spaced from each other in a plan view and a sectional view.

The first contact electrode CNE1 may be opposite to one area of the intermediate electrode CTE, e.g., the first intermediate electrode CTE1. The first contact electrode CNE1 and the first intermediate electrode CTE1 may extend in the same direction, e.g., in the second direction DR2. The first contact electrode CNE1 and the first intermediate electrode CTE1 may be spaced from each other in the first direction DR1.

The second contact electrode CNE2 may be opposite to the other area of the intermediate electrode CTE, e.g., the second intermediate electrode CTE2. The second contact electrode CNE2 and the second intermediate electrode CTE2 may extend in the second direction DR2. The second contact electrode CNE2 and the second intermediate electrode CTE2 may be spaced from each other in the first direction DR1.

The intermediate electrode CTE may be formed of various transparent conductive materials to allow light emitted from each of the light emitting elements LD and reflected by the first to fourth electrodes EL1 to EL4 to travel in the image display direction of the display device without loss.

The intermediate electrode CTE may be located at the same layer as that of the first and second contact electrodes CNE1 and CNE2 and may be formed through the same process as that of the first and second contact electrodes CNE1 and CNE2. For example, the intermediate electrode CTE and the first and second contact electrodes CNE1 and CNE2 may be provided and/or formed on the second insulating layer INS2. However, the present disclosure is not limited thereto. In some embodiments, the intermediate electrode CTE may be provided on a layer different from that of the first and second contact electrodes CNE1 and CNE2 and may be formed through a process different therefrom.

A third insulating layer INS3 may be provided and/or formed on the first contact electrode CNE1, the second contact electrode CNE2, and the intermediate electrode CTE. The third insulating layer INS3 may be an inorganic insulating layer including inorganic material or an organic insulating layer including organic material. For example, the third insulating layer INS3 may have a structure formed by alternately stacking at least one inorganic insulating layer and at least one organic insulating layer. The third insulating layer INS3 may cover the entirety of the display element layer DPL and prevent water or moisture from being drawn into the display element layer DPL including the light emitting elements LD from the outside.

In some embodiments, the display element layer DPL may selectively further include an optical layer as well as including the third insulating layer INS3. For example, the display element layer DPL may further include a color conversion layer including color conversion particles for converting the color of light emitted from the light emitting elements LD to a specific color of light.

When driving current flows from the first power line PL1 to the driving voltage line DVL by the driving transistor Tdr of the pixel circuit layer PCL included in each pixel PXL, the driving current may be drawn into the emission unit EMU of each pixel PXL through the first contact hole CH1.

For example, driving current may be supplied to the first electrode EL1 through the first contact hole CH1. The driving current may flow to the intermediate electrode CTE via the first light emitting elements LD1 through the first contact electrode CNE1 that is brought into contact with (or is connected with) the first electrode EL1 through the first via hole VIH1. Hence, in the first serial set SET1, the first light emitting elements LD1 may emit light at a luminance corresponding to current distributed to each first light emitting element LD1.

Driving current flowing to the intermediate electrode CTE may flow to the second contact electrode CNE2 via the intermediate electrode CTE and the second light emitting elements LD2. Hence, in the second serial set SET2, the second light emitting elements LD2 may emit light at a luminance corresponding to current distributed to each second light emitting element LD2.

As described above, driving current of each pixel PXL may flow successively via the first light emitting elements LD1 of the first serial set SET1 and the second light emitting elements LD2 of the second serial set SET2. Hence, each pixel PXL may emit light at a luminance corresponding to a data signal supplied during each frame period.

The first contact electrode CNE1 and the intermediate electrode CTE (e.g., CTE1), along with the first light emitting elements LD1, the first electrode EL1, and the second electrode EL2, may form the first serial set SET1. The intermediate electrode CTE (e.g., CTE2) and the second contact electrode CNE2, along with the second light emitting elements LD2, the third electrode EL3, and the fourth electrode EL4, may form the second serial set SET2.

In the foregoing embodiment, at the step of forming the first contact electrode CNE1 of the first serial set SET1 and the second contact electrode CNE2 of the second serial set SET2, the intermediate electrode CTE for coupling the first serial set SET1 and the second serial set SET2 may be concurrently formed (e.g., simultaneously formed). Therefore, the process of fabricating each pixel PXL and the display device including the pixel PXL may be simplified, so that the product yield can be enhanced.

In some embodiments, the emission unit EMU has a serial/parallel combination structure. As such, each pixel PXL can be reliably driven, so that driving current flowing to the display panel of the display device can be reduced, whereby the power consumption efficiency can be improved.

Figure 16A:
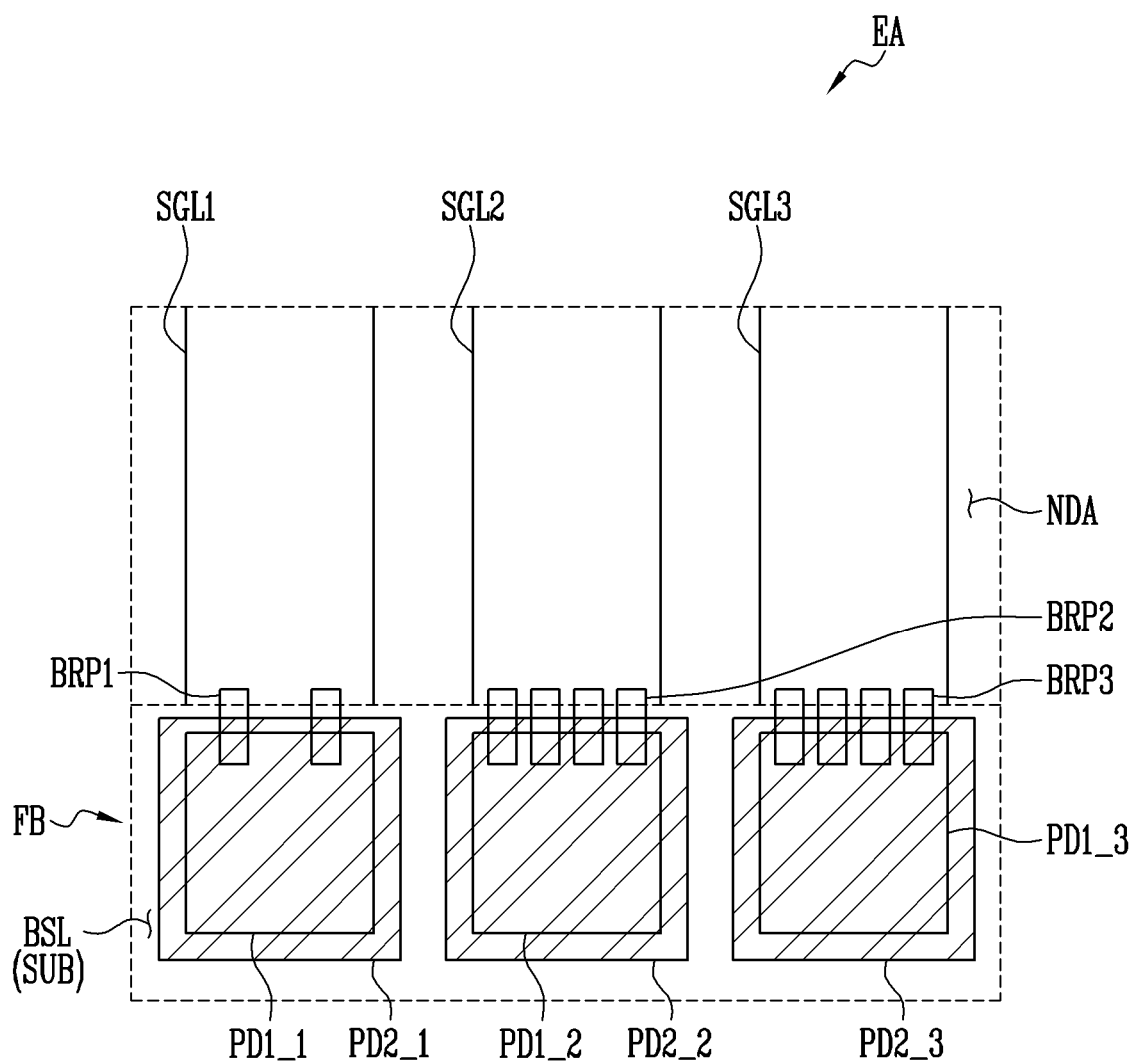
Figure 17:
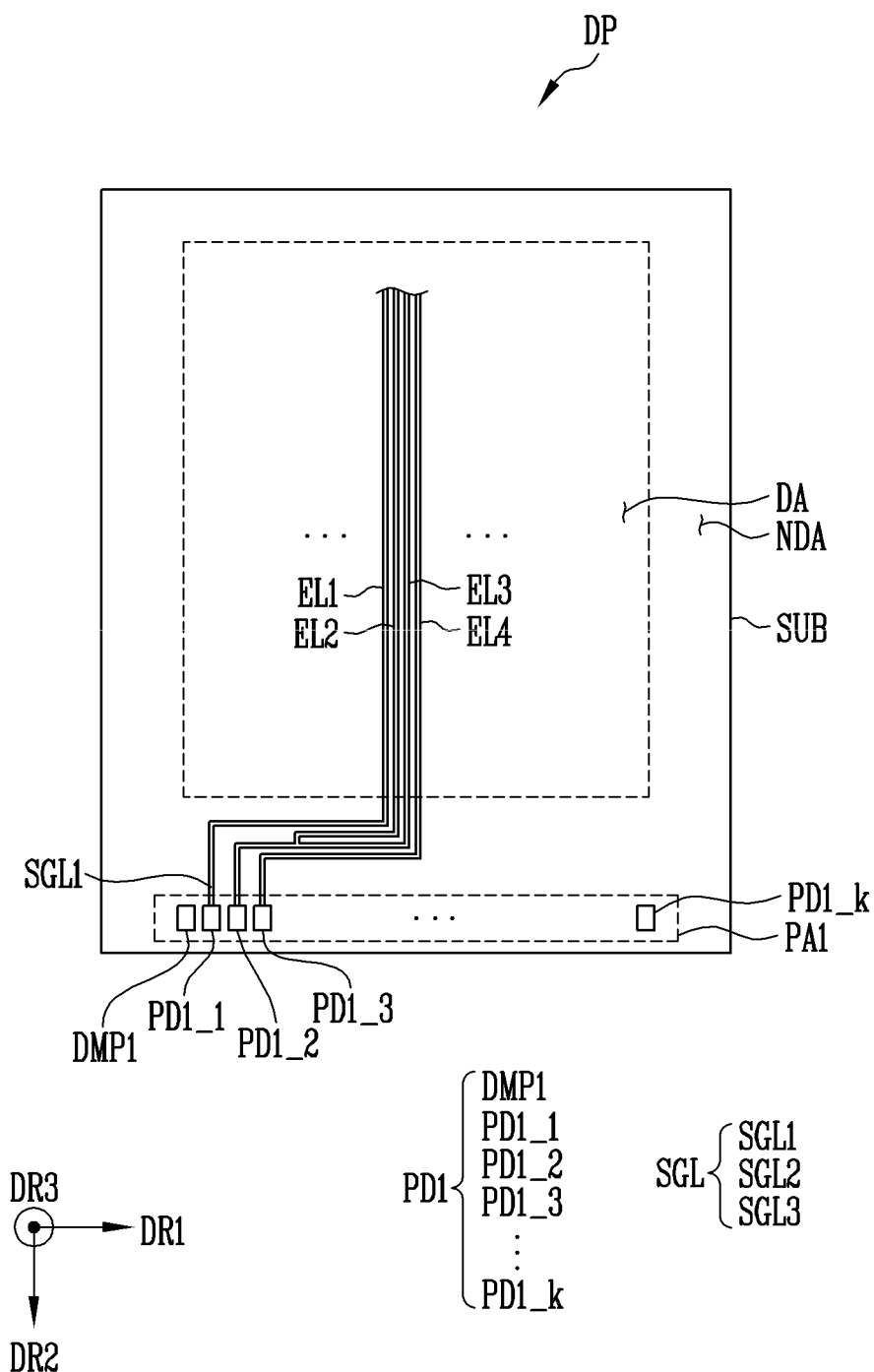
FIG. 17 is a plan diagram schematically illustrating a display panel before light emitting elements are aligned.
Figure 18:
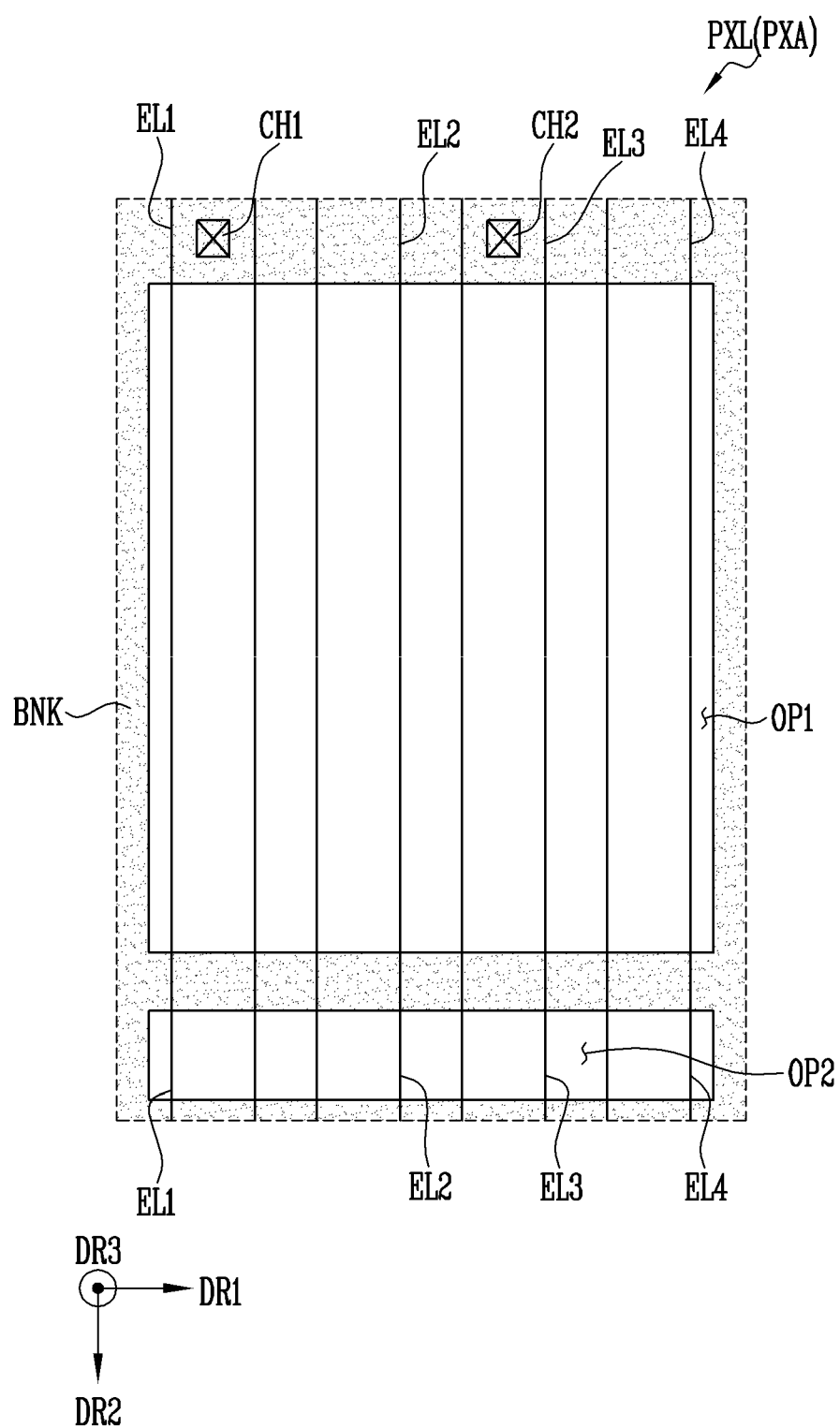
FIG. 18 is a plan diagram schematically illustrating one pixel before light emitting elements are aligned.

FIGS. 14A and 14B are plan diagrams schematically illustrating a circuit board in accordance with some embodiments of the present disclosure. FIG. 15 is a schematic sectional view taken along the line II-II' of FIG. 5A. FIGS. 16A and 16B are schematic plan diagrams showing an enlargement of area EA of FIG. 5A. FIG. 17 is a plan diagram schematically illustrating a display panel before light emitting elements are aligned. FIG. 18 is a plan diagram schematically illustrating one pixel before light emitting elements are aligned.

The description with reference to FIGS. 14A-18 will be focused on differences from the above-mentioned embodiments so as to avoid redundant description.

Referring to FIGS. 1-18, the display device DD may include a display panel DP on which the first pads PD1 are provided, and a circuit board FB on which the second pads PD2 and the driver DC are provided.

The display panel DP may be electrically connected with the circuit board FB by a conductive adhesive ACF. The conductive adhesive ACF may be formed of an anisotropic conductive film. For example, the conductive adhesive ACF may include conductive particles PI formed in an adhesive film PF having adhesiveness. The conductive particles PI may electrically connect the first pads PD1 of the display panel DP with the second pads PD2 of the circuit board FB. Hence, signals of voltages of the driving power supply that are transmitted to the second pads PD2 through the driver DC mounted on the circuit board FB may be transmitted to the first pads PD1 of the display panel DP through the conductive adhesive ACF.

The first pads PD1 may be provided at intervals (e.g., set or predetermined intervals) on the first pad area PA1 disposed in the non-display area NDA of the substrate SUB. For example, first to kth first pads PD1_1 to PD1_$k$ ($k$ is a natural number of 2 or more) may be disposed in the first pad area PA1. Furthermore, at least one first dummy pad DMP1 and at least one test pad may be disposed in the first pad area PA1, but the present disclosure is not limited thereto.

The first pads PD1 may include a 1-1th pad PD1_1 electrically connected to the first driving voltage supply line SGL1 through a first bridge pattern BRP1, a 1-2th pad PD1_2 electrically connected to the second driving voltage supply line SGL2 through a second bridge pattern BRP2, and a 1-3th pad PD1_3 electrically connected to the third driving voltage supply line SGL3 through a third bridge pattern BRP3. The 1-1th pad PD1_1, the 1-2th pad PD1_2, and the 1-3th pad PD1_3 may be electrically connected to the second pads PD2.

The second pads PD2 disposed in the second pad area PA2 of the circuit board FB may be provided at intervals (e.g., set or predetermined intervals) on the first base layer BSL1. For example, first to nth second pads PD2_1 to PD2_$n$ ($n$ is a natural number of 2 or more) may be disposed in the second pad area PA2 of the first base layer BSL1.

The third pads PD3 disposed in the third pad area PA3 of the circuit board FB may be provided at intervals (e.g., set or predetermined intervals) on the first base layer BSL1. For example, first to n+1th third pads PD3_1 to PD3_$n$+1 ($n$ is a natural number of 2 or more) may be disposed in the third pad area PA3 of the first base layer BSL1. Although in the foregoing embodiment the number of third pads PD3 is different from the number of second pads PD2, the present disclosure is not limited thereto. In some embodiments, the number of the third pads PD3 disposed in the third pad area PA3 may be the same as the number of second pads PD2.

The second pads PD2 may include a data signal output pad configured to output driving signals input from a timing controller mounted on the printed circuit board PB to the display panel DP, and output a signal output from the driver DC mounted on the first base layer BSL1, e.g., a data signal (or an image signal), to the display panel DP. Furthermore, the second pads PD2 may include power supply pads PWP configured to output, to the display panel DP, a voltage (e.g., a set or predetermined voltage) of the driving power supply that is output from a power supply pad electrically connected with a power supply mounted on the printed circuit board PB from among output pads OPD of the driver DC. In some embodiments, the second pads PD2 may include at least one second dummy pad DMP2.

The power supply pads PWP may include a 2-1th pad PD2_1, a 2-2th pad PD2_2, and a 2-3th pad PD2_3. The 2-1th pad PD2_1, the 2-2th pad PD2_2, and the 2-3th pad PD2_3 may be respectively electrically connected to the corresponding output pads OPD of the driver DC Among the 2-1th to 2-3th pads PD2_1 to PD2_3, the 2-1th pad PD2_1 and the 2-2th PD2_2 that are directly adjacent to each other in the first direction DR1 may be electrically connected with the same output pad OPD (hereinafter, referred to as 'first output pad') of the driver DC by a conductive line CL. The 2-3th pad PD2_3 may be electrically connected with another output pad OPD (hereinafter, referred to as 'second output pad') of the driver DC through a conductive line CL. Here, the first output pad OPD and the second output pad OPD each may be a power supply output pad electrically connected with the power supply mounted on the printed circuit board PB.

Because the 2-1th and 2-2th pads PD2_1 and PD2_2 are electrically connected to the first output pad OPD of the driver DC, an identical signal may be applied to the 2-1th and 2-2th pads PD2_1 and PD2_2. If the first output pad OPD of the driver DC is a first power supply output pad configured to supply the voltage of a low-potential level driving power supply, the voltage of the low-potential level driving power supply may be concurrently applied (e.g., simultaneously applied) to the 2-1th and 2-2th pads PD2_1 and PD2_2.

A signal different from the signal to be applied to the 2-1th and 2-2th pads PD2_1 and PD2_2 may be applied to the 2-3th pad PD2_3. If the second output pad OPD of the driver DC is a second power supply output pad configured to supply the voltage of a high-potential level driving power supply, the voltage of the high-potential level driving power supply may be applied to the 2-3th pad PD2_3. The low-potential level driving power supply may be the second driving power supply VSS described with reference to FIG. 7. The high-potential level driving power supply may be the first driving power supply VDD described with reference to FIG. 7.

The 2-1th to 2-3th pads PD2_1 to PD2_3 may be electrically connected with the first pads PD1 disposed on the substrate SUB of the display panel DP. For example, the 2-1th pad PD2_1 may be electrically connected with the 1-1th pad PD1_1 through the conductive adhesive ACF. The 2-2th pad PD2_2 may be electrically connected with the 1-2th pad PD1_2 through the conductive adhesive ACF. The 2-3th pad PD2_3 may be electrically connected with the 1-3th pad PD1_3 through the conductive adhesive ACF.

In a plan view, the 2-1th pad PD2_1 may overlap with the 1-1th pad PD1_1, the 2-2th pad PD2_2 may overlap with the 1-2th pad PD1_2, and the 2-3th pad PD2_3 may overlap with the 1-3th pad PD1_3.

In the foregoing embodiment, there has been described an example where the 2-1th pad PD2_1 is electrically connected with the 1-1th pad PD1_1, and the 2-2th pad PD2_2 is electrically connected with the 1-2th pad PD1_2, so that an identical signal is concurrently applied (e.g., simultaneously applied) to the 1-1th and 1-2th pads PD1_1 and PD1_2. However, the present disclosure is not limited thereto. In some embodiments, as illustrated in FIGS. 14B and 16B, one second pad PD2, e.g., the 2-1th pad PD2_1, may be electrically connected with the 1-1th and 1-2th pads PD1_1 and PD1_2, so that an identical signal may be concurrently applied (e.g., simultaneously applied) to the 1-1th and 1-2th pads PD1_1 and PD1_2. In this case, the 2-2th pad PD2_2 may be electrically connected with the 1-3th pad PD1_3. In a plan view, the 2-1th pad PD2_1 may overlap with the 1-1th and 1-2th pads PD1_1 and PD1_2, as illustrated in FIG. 16B.

As described above, because an identical signal is applied to the 2-1th and 2-2th pads PD2_1 and PD2_2, an identical signal, e.g., the voltage of the low-potential level driving power supply, may be applied to the 1-1th and 1-2th pads PD1_1 and PD1_2. In other words, the voltage of the second driving power supply VSS may be applied to the 1-1th and 1-2th pads PD1_1 and PD1_2.

Because the 1-1th pad PD1_1 is electrically connected with the first driving voltage supply line SGL1 through the first bridge pattern BRP1, the voltage of the second driving power supply VSS may be applied to the first driving voltage supply line SGL1. Because the 1-2th pad PD1_2 is electrically connected with the second driving voltage supply line SGL2 through the second bridge pattern BRP2, the voltage of the second driving power supply VSS may be applied to the second driving voltage supply line SGL2. Because the 1-3th pad PD1_3 is electrically connected with the third driving voltage supply line SGL3 through the third bridge pattern BRP3, the voltage of the first driving power supply VDD may be applied to the third driving voltage supply line SGL3.

The first to third driving voltage supply lines SGL1 to SGL3 each may function as an alignment signal supply line configured to apply a corresponding alignment signal (or an alignment voltage) to a corresponding electrode of the first to fourth electrodes EL1 to EL4 provided in each pixel PXL before light emitting elements LD are aligned in each of the pixels PXL. Here, the first to fourth electrodes EL1 to EL4 of each pixel PXL may be provided and connected integrally with the first to fourth electrodes EL1 to EL4 provided in pixels PXL adjacent to each other in the second direction DR2, as illustrated in FIGS. 17 and 18. Before light emitting elements LD are aligned in each of the pixels PXL, the first pads PD1 may be electrically connected with an external alignment signal pad and may not be bonded to the circuit board FB. In this case, the first driving voltage supply line SGL1 may transmit a first alignment signal from a first alignment signal pad electrically connected with the 1-1th pad PD1_1 to the first electrode EL1 from among the first to fourth electrodes EL1 to EL4. The second driving voltage supply line SGL2 may transmit a second alignment signal from a second alignment signal pad electrically connected with the 1-2th pad PD1_2 to the second and third electrodes EL2 and EL3 from among the first to fourth electrodes EL1 to EL4. The third driving voltage supply line SGL3 may transmit a third alignment signal from a third alignment signal pad electrically connected with the 1-3th pad PD1_3 to the fourth electrode EL4. The first to fourth electrodes EL1 to EL4 may be supplied with corresponding alignment signals, so that an electric field may be formed between two adjacent electrodes. If light emitting elements LD are supplied to each of the pixels PXL after the electric field has been formed, the light emitting elements LD may be aligned between two adjacent electrodes of the first to fourth electrodes EL1 to EL4.

After the light emitting elements LD have been aligned, the first to third driving voltage supply lines SGL1 to SGL3 may be electrically separated from the first to fourth electrodes EL1 to EL4. In this case, two driving voltage supply lines from among the first to third driving voltage supply lines SGL1 to SGL3 may be used as power lines for supplying the voltages of the driving power supplies that are needed to drive the pixels PXL, and the other one driving voltage supply line may float without functioning as a component other than an alignment signal supply line. For example, the second and third driving voltage supply lines SGL2 and SGL3 from among the first to third driving voltage supply lines SGL1 to SGL3 may function as power lines after the light emitting elements LD have been aligned, and the first driving voltage supply line SGL1 may float. Due to the first driving voltage supply line SGL1 that floats, image characteristic deterioration resulting from unpredictable coupling may occur when the display panel DP is driven.

Given this, in some embodiments of the present disclosure, as illustrated in FIG. 16A, the display device may be designed such that a signal equal to that of the 2-2th pad PD2_2, e.g., the voltage of the second driving power supply VSS, is applied to the 2-1th pad PD2_1 electrically connected with the first driving voltage supply line SGL1 from among the second pads PD2 of the circuit board FB attached to the display panel DP after the light emitting elements LD have been aligned. Furthermore, as illustrated in FIG. 16B, in some embodiments of the present disclosure, the display device may be designed such that the voltage of the second driving power supply VSS is applied to the 2-1th pad PD2_1 from among the second pads PD2 of the circuit board FB attached to the display panel DP after the light emitting elements LD have been aligned, so that an identical signal may be applied to the first and second driving voltage supply lines SGL1 and SGL2 through the 1-1th and 1-2th pads PD1_1 and PD1_2 electrically connected with the 2-1th pad PD2_1.

As described above, the voltage of the second driving power supply VSS may be applied to the first driving voltage supply line SGL1, so that the first driving voltage supply line SGL1 may be prevented from floating after the light emitting elements LD have been aligned. The first driving voltage supply line SGL1 to which the voltage of the second driving power supply VSS is applied, along with the second and third driving voltage supply lines SGL2 and SGL3, may be used as power lines for driving the pixels PXL after the light emitting elements LD have been aligned. For example, because the first and second driving voltage supply lines SGL1 and SGL2 are used as power lines to which an identical signal is applied, a separate power line for supply of the voltage of a power supply other than the first driving power supply VDD and the second driving power supply VSS is not needed, so that the widths of the power lines can be increased, whereby distortion due to a signal delay may be mitigated.

Furthermore, because an existing signal, e.g., the voltage of the second driving power supply VSS, is supplied to the first driving voltage supply line SGL1 through the 2-1th pad PD2_1 of the circuit board FB, additional pads of the circuit board FB for allocation of additional signals may not needed. Hence, there is no need to fabricate a new circuit board including additional pads, so that the cost of fabricating the display device may not be increased.

While various example embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims and their equivalents.

What is claimed is:
1. A display device comprising:
a substrate comprising a display area and a non-display area;
a plurality of pixels in the display area of the substrate, each of the pixels comprising a first electrode, a second electrode, a third electrode, and a fourth electrode spaced from each other and a plurality of light emitting elements electrically connected with the first to the fourth electrodes;
a plurality of first pads in a pad area of the non-display area of the substrate;
a first line, a second line, and a third line in the non-display area of the substrate, each of the first to the third lines being configured to receive a driving voltage;
a circuit board overlapping the pad area of the substrate and comprising second pads electrically connected with the first pads; and
a first contact electrode on the first electrode, an intermediate electrode on the second and the fourth electrodes, and a second contact electrode on the third electrode to connect to the plurality of light emitting elements to the first to fourth electrodes, wherein the intermediate electrode encloses the second contact electrode in a plan view,
wherein the first pads comprise a 1-1th pad electrically connected to the first line, a 1-2th pad electrically connected to the second line, and a 1-3th pad electrically connected to the third line,
wherein at least two lines of the first to the third lines are configured to receive the driving voltage having a first value, and
wherein the first to third lines are to apply alignment signals to the first to the fourth electrodes to align the plurality of light emitting elements therebetween.

2. The display device according to claim 1, wherein the circuit board further comprises a driver comprising a plurality of output pads electrically connected to the second pads.

3. The display device according to claim 2, wherein the second pads comprise:
a 2-1th pad electrically connected with the 1-1th pad;
a 2-2th pad electrically connected with the 1-2th pad; and
a 2-3th pad electrically connected with the 1-3th pad,
wherein the 2-1th and 2-2th pads from among the 2-1th to 2-3th pads are electrically connected with one output pad of the driver.

4. The display device according to claim 1, wherein the driving voltage having the first value is to be applied to the 1-1th pad and the 1-2th pad.

5. The display device according to claim 4, wherein the driving voltage having the first value is to be applied to the first line and the second line.

6. The display device according to claim 5, wherein the driving voltage having the first value is to be applied to the first and the second lines is different from a driving voltage to be applied to the third line.

7. The display device according to claim 6, wherein a first driving voltage is to be applied to the third line, and a second driving voltage having a second level lower than a first level of the first driving voltage is to be applied to the first and the second lines, the second driving voltage being the driving voltage having the first value.

8. The display device according to claim 1, wherein a second pad of the second pads is electrically connected with the 1-1th and the 1-2th pads.

9. The display device according to claim 8, wherein the driving voltage having the first value is to be applied to the 1-1th and the 1-2th pads.

10. The display device according to claim 1, further comprising:
an anisotropic conductive film between the substrate and the circuit board to electrically connect the first pads with the second pads, wherein the anisotropic conductive film comprises:
an adhesive film located between the substrate and the circuit board; and
conductive particles in the adhesive film to electrically connect the first pads with the second pads.

11. The display device according to claim 1, wherein each of the pixels further comprises a pixel circuit layer on the substrate, the pixel circuit layer comprising at least one transistor electrically connected with the light emitting elements.

12. The display device according to claim 11, wherein the light emitting elements comprise:
first light emitting elements of the light emitting elements aligned between the first electrode and the second electrode; and
second light emitting elements of the light emitting elements aligned between the third electrode and the fourth electrode.

13. The display device according to claim 12, wherein, the first and the second light emitting elements are aligned, and the first to the fourth electrodes are electrically coupled with the first to the third lines.

14. The display device according to claim 13, wherein the alignment signals to be applied to the first to the fourth electrodes from the first to the third lines are different from each other.

15. The display device according to claim 12, wherein after the first and the second light emitting elements are aligned, the first to the fourth electrodes are electrically separated from the first to the third lines.

16. The display device according to claim 12, wherein each of the pixels comprises:
the first contact electrode on the first electrode to connect the first electrode with respective first ends of the first light emitting elements;
the intermediate electrode on the second and the fourth electrodes to connect respective second ends of the first light emitting elements with respective first ends of the second light emitting elements; and
the second contact electrode on the third electrode to connect the third electrode with respective second ends of the second light emitting elements.

17. The display device according to claim 16,
wherein the first contact electrode, the intermediate electrode, and the second contact electrode are spaced from each other.

18. The display device according to claim 17,
wherein the first light emitting elements form a first serial set coupled in parallel between the first electrode and the second electrode, and
wherein the second light emitting elements form a second serial set coupled in parallel between the third electrode and the fourth electrode.

19. The display device according to claim 18, wherein the first electrode comprises an anode electrode, and the third electrode comprises a cathode electrode.

20. A display device comprising:
a display panel comprising a display area in which a plurality of pixels are located, and a non-display area in which a first line, a second line, and a third line to which a driving voltage is to be applied are located, the non-display area comprising a pad area in which a plurality of first pads are located;
a circuit board in contact with at least one side of the display panel, and comprising second pads electrically connected with the first pads;
a printed circuit board in contact with at least one side of the circuit board; and
an anisotropic conductive film located between the display panel and the circuit board and between the circuit board and the printed circuit board,
wherein the first pads comprises a 1-1th pad electrically connected to the first line, a 1-2th pad electrically connected to the second line, and a 1-3th pad electrically connected to the third line,
wherein each of the pixels comprises:
a first electrode, a second electrode, a third electrode, and a fourth electrode spaced from each other,
a plurality of light emitting elements electrically connected with the first to the fourth electrodes, and
a first contact electrode on the first electrode, an intermediate electrode on the second and the fourth electrodes, and a second contact electrode on the third electrode to connect to the plurality of light emitting elements to the first to fourth electrodes, wherein the intermediate electrode encloses the second contact electrode in a plan view,
wherein at least two lines of the first to the third lines are configured to receive the driving voltage having a first value, and
wherein the first to the third lines are to apply alignment signals to the first to fourth electrodes to align the plurality of light emitting elements therebetween.

* * * * *